(12) United States Patent
Eriksson et al.

(10) Patent No.: US 9,279,834 B2
(45) Date of Patent: Mar. 8, 2016

(54) HIGH-VOLTAGE SENSOR WITH AXIALLY OVERLAPPING ELECTRODES AND LOCAL FIELD SENSORS

(71) Applicant: ABB RESEARCH LTD, Zürich (CH)

(72) Inventors: Göran Eriksson, Västerås (SE); Klaus Bohnert, Oberrohrdorf (CH); Sergio Vincenzo Marchese, Zürich (CH); Stephan Wildermuth, Mülligen (CH)

(73) Assignee: ABB RESEARCH LTD, Zurich (CH)

( * ) Notice: Subject to any disclaimer, the term of this patent is extended or adjusted under 35 U.S.C. 154(b) by 635 days.

(21) Appl. No.: 13/707,987

(22) Filed: Dec. 7, 2012

(65) Prior Publication Data
US 2013/0093410 A1    Apr. 18, 2013

Related U.S. Application Data

(63) Continuation of application No. PCT/EP2011/055408, filed on Apr. 7, 2011.

(30) Foreign Application Priority Data

Jun. 7, 2010 (WO) .................. PCT/EP2010/057872

(51) Int. Cl.
*G01R 31/00* (2006.01)
*G01R 19/00* (2006.01)
*G01R 15/24* (2006.01)

(52) U.S. Cl.
CPC .......... *G01R 19/0046* (2013.01); *G01R 15/242* (2013.01)

(58) Field of Classification Search
CPC ............ G01R 15/241–15/247; G01R 19/0046; G01R 1/071

USPC .......................................................... 324/96
See application file for complete search history.

(56) References Cited

U.S. PATENT DOCUMENTS 2,288,969 A * 7/1942 Kirkwood ..................... 174/143
3,462,545 A   8/1969 Grimmer
(Continued)

FOREIGN PATENT DOCUMENTS

| CH | 547 496 A | | 3/1974 |
|----|-----------|---|--------|
| CH | 547496    | * | 3/1974 |

(Continued)

OTHER PUBLICATIONS

Notification Concerning Transmittal of International Preliminary Report on Patentability (Form PCT/IB/326 and PCT/IB/373) and the Written Opinion of the International Searching Authority (Form PCT/ISA/237) dated Dec. 20, 2012, issued in corresponding International Application No. PCT/EP2011/059399. (7 pages).

(Continued)

*Primary Examiner* — Daniel Miller
(74) *Attorney, Agent, or Firm* — Buchanan Ingersoll & Rooney PC

(57) ABSTRACT

A voltage sensor includes an insulator with mutually insulated electrodes embedded therein. The electrodes are coaxial and cylindrical and overlap axially along part of their lengths. They are mutually staggered and control the surfaces of electric equipotential such that there is a substantially homogeneous electric field outside the insulator and a substantially homogeneous but higher field within a sensing cavity within the insulator. A field sensor is arranged within the sensing cavity to locally measure the field. This design allows for the production of compact voltage sensors for high voltage applications.

37 Claims, 11 Drawing Sheets

(56) References Cited

U.S. PATENT DOCUMENTS

| | | | |
|---|---|---|---|
| 3,875,327 | A | 4/1975 | Hildenbrand |
| 4,362,897 | A | 12/1982 | Matthaus et al. |
| 4,370,514 | A * | 1/1983 | Matthaus et al. ........... 174/31 R |
| 4,904,931 | A | 2/1990 | Miller |
| 4,929,830 | A | 5/1990 | Bohnert et al. |
| 5,001,419 | A | 3/1991 | Miller |
| 5,029,273 | A | 7/1991 | Jaeger |
| 5,339,026 | A | 8/1994 | Bohnert |
| 5,715,058 | A | 2/1998 | Bohnert et al. |
| 5,936,395 | A | 8/1999 | Kevorkian et al. |
| 6,140,810 | A | 10/2000 | Bohnert et al. |
| 6,252,388 | B1 | 6/2001 | Jaeger et al. |
| 6,348,786 | B1 | 2/2002 | Bjarme et al. |
| 6,380,725 | B1 | 4/2002 | Chavez et al. |
| 6,876,188 | B2 | 4/2005 | Bohnert et al. |
| 7,123,032 | B2 * | 10/2006 | Yakymyshyn et al. ....... 324/705 |
| 2009/0289617 | A1 | 11/2009 | Bohnert |
| 2010/0109642 | A1 | 5/2010 | Sato et al. |
| 2010/0283451 | A1 | 11/2010 | Mitrofanov |

FOREIGN PATENT DOCUMENTS

| | | |
|---|---|---|
| DE | 198 38 354 A1 | 2/2000 |
| EP | 0 316 635 A1 | 5/1989 |
| EP | 0 316 619 B1 | 12/1993 |
| EP | 0 789 245 A2 | 8/1997 |
| EP | 1 154 278 B1 | 10/2004 |
| EP | 1 939 897 A1 | 7/2008 |
| EP | 2 138 853 A1 | 12/2009 |
| WO | WO 98/05975 A1 | 2/1998 |
| WO | WO 2004/086064 A1 | 10/2004 |
| WO | WO 2007/121592 A1 | 11/2007 |
| WO | WO 2008/077255 A1 | 7/2008 |
| WO | WO 2009/138120 A1 | 11/2009 |

OTHER PUBLICATIONS

Bohnert, "Fiber Optic Voltage Sensor for kV Electric Power Systems" Optical Engineering, (Nov. 2000), vol. 39, No. 11, pp. 3060-3067.

Duvillaret et al.,"Electro-optic Sensors for Electric Field Measurements. II. Choice of the Crystals and Complete Optimization of their Orientation" Journal of the Optical Society of America B, (Nov. 2002), vol. 19, No. 11, pp. 2704-2715.

Jaeger et al., "Integrated Optics Pockels Cell High-Voltage Sensor" IEEE Transactions on Power Delivery, (Jan. 1995), vol. 10, No. 1, pp. 127-134.

Standard of the International Electro Technical Commission IEC6044-7, Instrument transformers Part 7, Electronic Voltage Transformers, First Edition, (1999), (70 pages).

International Search Report (PCT/ISA/210) issued on Aug. 10, 2011, by the European Patent Office as the International Searching Authority for International Application No. PCT/EP2011/055408.

Written Opinion (PCT/ISA/237) issued on Aug. 10, 2011, by the European Patent Office as the International Searching Authority for International Application No. PCT/EP2011/055408.

International Preliminary Report on Patentability (PCT/IPEA/409) issued on Jun. 21, 2012, by the European Patent Office as the International Searching Authority for International Application No. PCT/EP2011/055408.

Bohnert et al., "Optical fiber sensors for the electric power industry", Optics and Lasers in Engineering, Mar. 2005, pp. 511-526, vol. 43, No. 3-5.

Cole et al., "Synthetic-Heterodyne Interferometric Demodulation", IEEE Journal of Quantum Electronics, Apr. 1982, pp. 694-697, vol. QE-18, No. 4.

Urbanczyk et al., "Digital demodulation system for low-coherence interferometric sensors based on highly birefringent fibers", Applied Optics, Dec. 2001, pp. 6618-6625, vol. 40, No. 36.

Campbell et al., "A frequency-modulated continuous wave birefringent fibre-optic strain sensor based on a Sagnac ring configuaration", Meas. Sci. Technol., 1999 (month unknown), pp. 218-224.

Williams et al., "Optical, thermo-optic, electro-optic, and photoelastic properties of bismuth germanate ($Bi_4Ge_3O_{12}$)", Applied Optics, Jul. 1996, pp. 3562-3569, vol. 35, No. 19.

Massey et al., Electromagnetic field components their measurement using linear electrooptic and magnetooptic effects, Applied Optics, Nov. 1975, pp. 2712-2719, vol. 14, No. 11.

Frosio et al., "Reciprocal reflection interferometer for a fiber-optic Faraday current sensor", Applied Optics, Sep. 1994, pp. 6111-6122, vol. 33, No. 25.

Lawrence, "Lithium niobate integrated optics", Rep. Prog. Phys., 1993 (month unknown), pp. 363-429.

Lee et al., "Electromagnetic Field Sensor using Mach-Zehnder Waveguide Modulator", Microwave and Optical Technology Letters, Sep. 2006, pp. 1897-1899, vol. 48, No. 9.

Meyer et al., "Reversibility of photoinduced birefringence in ultralow-birefringence fibers", Optics Letters, Oct. 1996, pp. 1661-1663, vol. 21, No. 20.

International Search Report (PCT/ISA/210) issued on Sep. 5, 2011, by the European Patent Office as the International Searching Authority for International Application No. PCT/EP2011/059399.

* cited by examiner

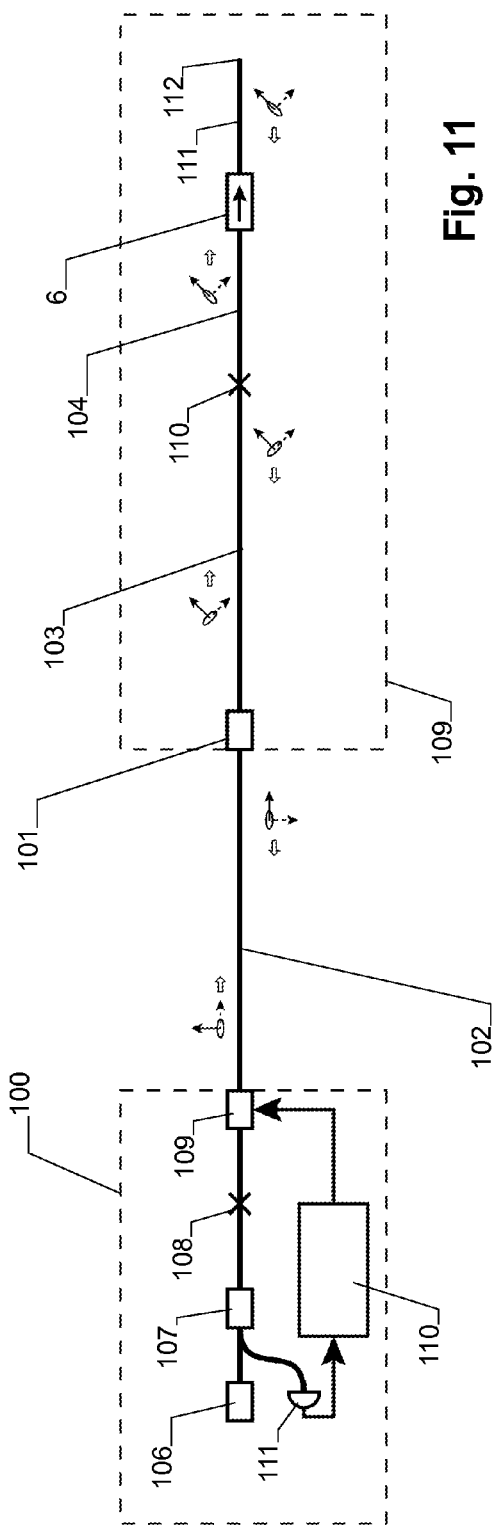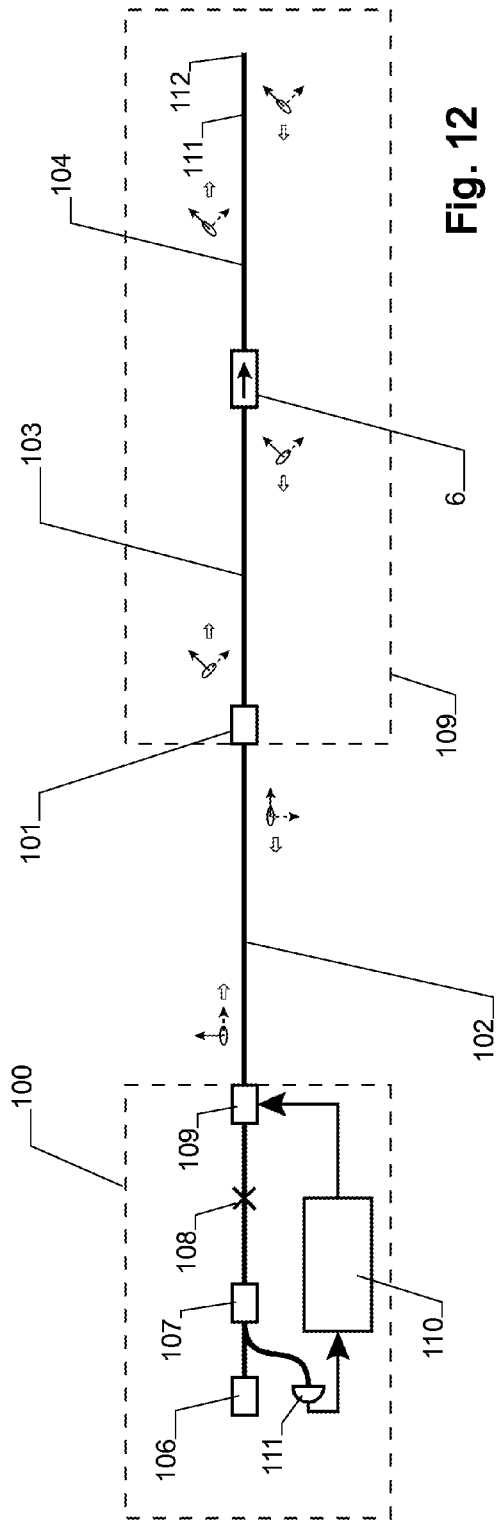

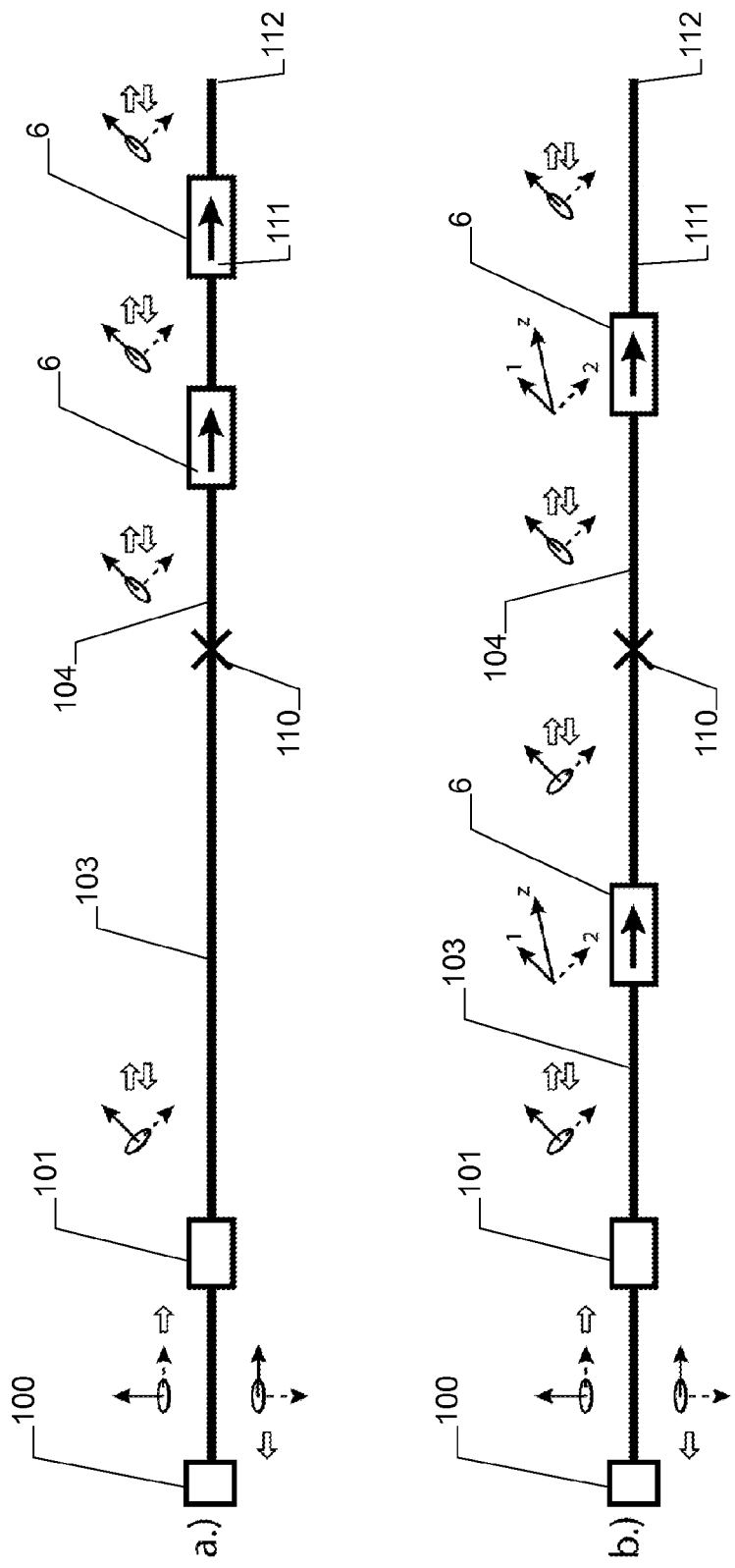
Fig. 13 a, b

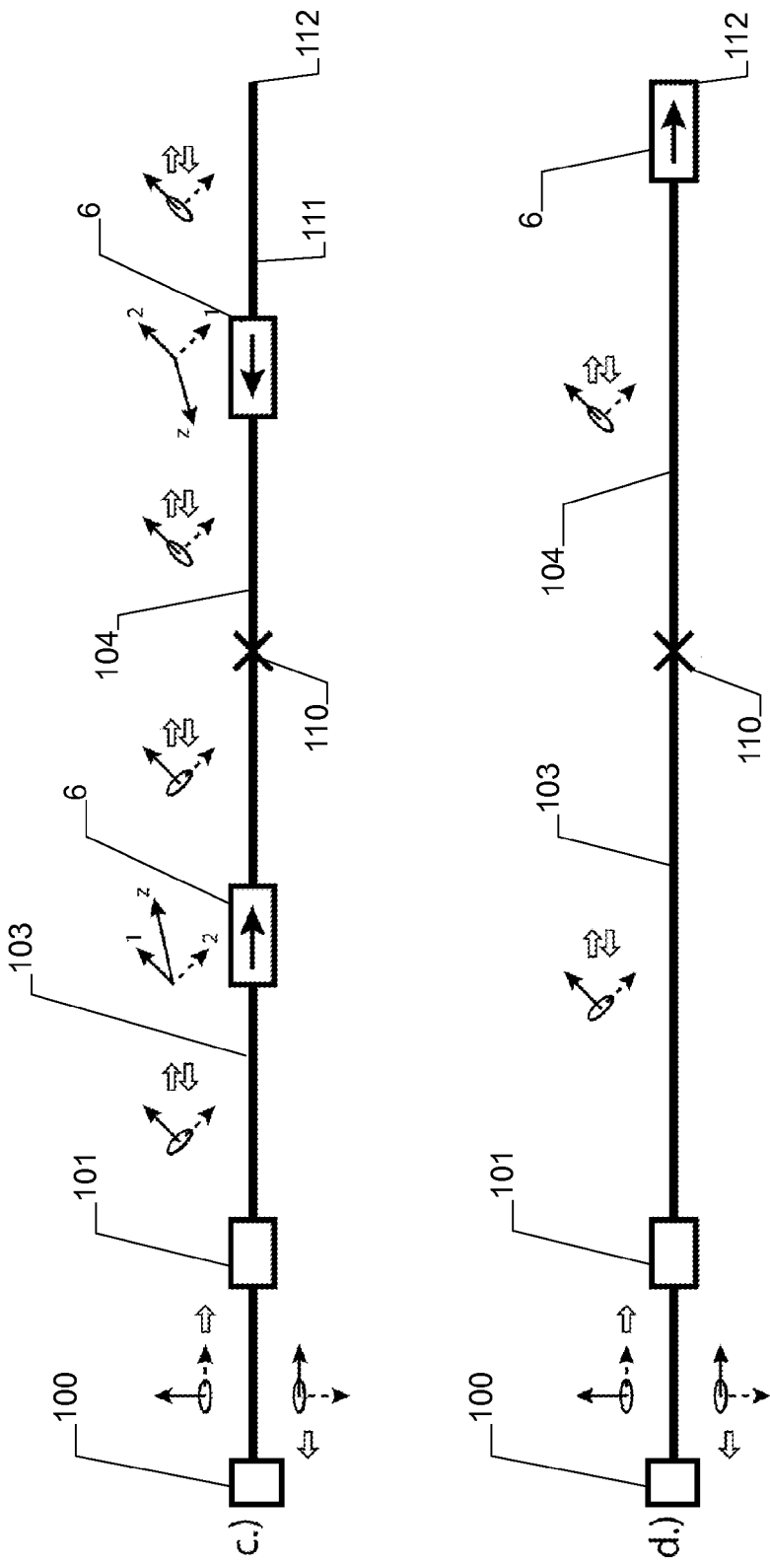
Fig. 13 c, d

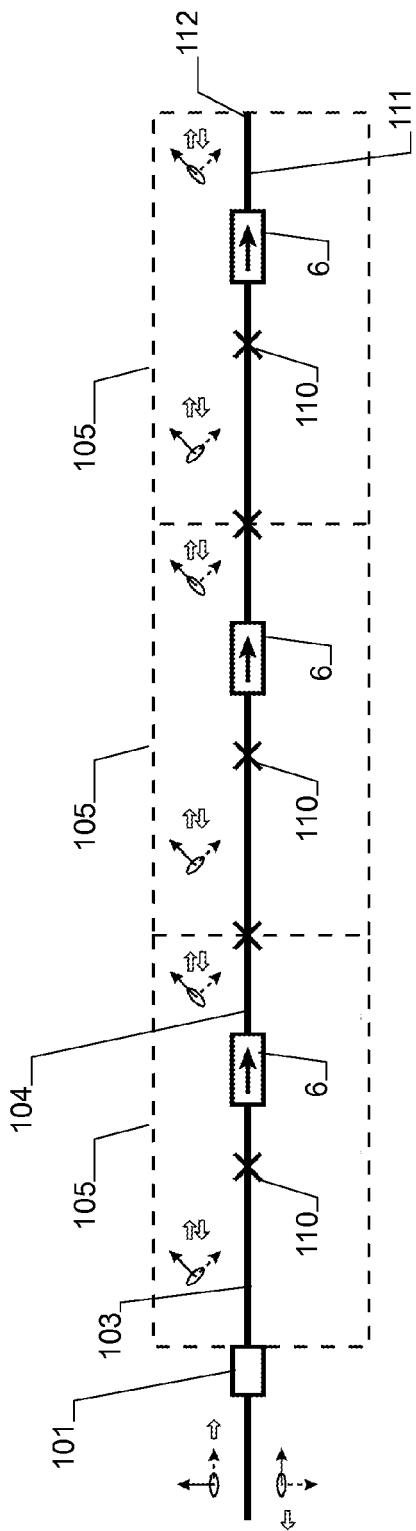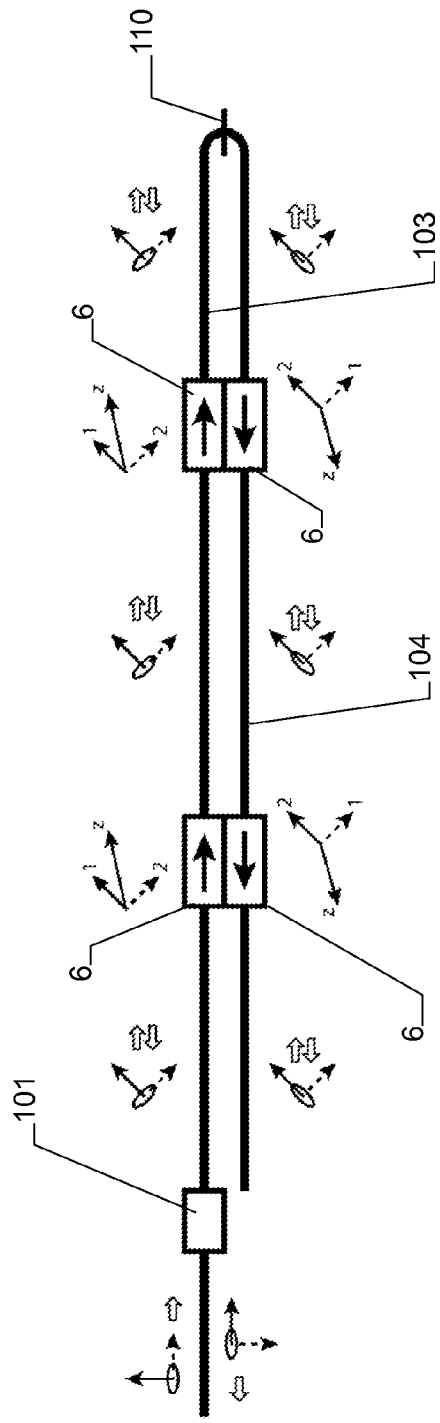

HIGH-VOLTAGE SENSOR WITH AXIALLY OVERLAPPING ELECTRODES AND LOCAL FIELD SENSORS

RELATED APPLICATION(S)

This application claims priority as a continuation application under 35 U.S.C. §120 to PCT/EP2011/055408 filed as an International Application on Apr. 7, 2011 designating the U.S., the entire content of which is hereby incorporated by reference in its entirety.

FIELD

The present disclosure relates to a voltage sensor for measuring a voltage between a first and a second contact point. More particularly, the present disclosure relates to a voltage sensor with a an insulator, such as a body of an insulating material, extending between the contact points and with electrodes arranged in the body. The present disclosure also relates to an assembly of several such voltage sensors arranged in series.

BACKGROUND INFORMATION

In the following description, publications referenced herein are identified with bracketed numbers (e.g., [1]) which refer to the list of references identified in the List of References following the description. Optical high-voltage sensors often rely on the electro-optic effect (Pockels effect) in crystalline materials such as $Bi_4Ge_3O_{12}$ (BGO) [1]. An applied voltage introduces a differential optical phase shift between two orthogonal, linearly polarized light waves propagating through the crystal. This phase shift is proportional to the voltage. At the end of the crystal, the light waves commonly interfere at a polarizer. The resulting light intensity serves as a measure for the phase shift and thus the voltage.

U.S. Pat. No. 4,904,931 [2] and U.S. Pat. No. 5,715,058 [3] disclose a sensor in which the full line voltage (up to several 100 kV) is applied over the length of a single BGO crystal [1]. A method used to retrieve the applied voltage from the resulting modulation pattern is described in [4]. An advantage is that the sensor signal corresponds to the true voltage (that is, the line integral of the electric field along the crystal). However, the electric field strengths at the crystal are very high. In order to obtain sufficient dielectric strength, the crystal is mounted in a hollow high-voltage insulator made of fiber-reinforced epoxy filled with $SF_6$ gas under pressure for electric insulation. The insulator diameter is sufficiently large to keep the field strength in the air outside the insulator below critical limits.

In EP 0 316 635 [5], a sensor is disclosed where the applied voltage is approximated by multiple local electric field measurements using piezoelectric sensing elements such as the ones described in more detail in EP 0 316 619 [6]. With proper choice and orientation of the piezoelectric crystals, only one component of the electric field is measured and thus the sensitivity to external field perturbations is reduced. A similar concept has been described in U.S. Pat. No. 6,140,810 [7]. Here, however, the individual piezoelectric sensing elements are equipped with field steering electrodes and connected with electric conductors such that full integration of the electric field is performed. Dividing the voltage among several crystals reduces the peak electric fields such that a slim insulator is sufficient to provide the required dielectric strength.

U.S. Pat. No. 6,252,388 [8] and U.S. Pat. No. 6,380,725 [9] disclose a voltage sensor which uses several small electro-optical crystals mounted at selected positions along the longitudinal axis of a hollow high-voltage insulator. The crystals measure the electric fields at their locations. The sum of these local field measurements serves as an approximation of the voltage applied to the insulator. Here, the field strengths at a given voltage are significantly lower than with the design of [2] and insulation with nitrogen at atmospheric pressure is sufficient. However, since the sensor does not measure the line integral of the field but derives the signal from the field strengths at a few selected points between ground and high voltage, extra measures (permittivity-shielding or resistive shielding) to stabilize the electric field distribution are necessary to avoid excessive approximation errors [9].

A drawback of the above concepts is the requirement of an expensive high-voltage insulator of large size. The outer dimensions are similar to the ones of corresponding known inductive voltage transformers or capacitive voltage dividers. Thus, the attractiveness of such optical sensors is limited.

Refs. [10] and [11] describe an electro-optical voltage sensor of the type as in [2, 3], but with an electro-optic crystal embedded in silicone. A hollow high-voltage insulator of large size and SF6-gas insulation is thus avoided. As in [7], the voltage may be partitioned on several crystals.

When only a fraction of the total voltage is measured, more compact integrated sensor arrangements can be used. See, for example, U.S. Pat. No. 5,029,273 [12].

Various techniques used to extract the electro-optic phase modulation from the measured signals are known. As described above, the technique used in [4] relies on the applied voltage exceeding the half-wave voltage of the electro-optic crystal. Moreover, a signal at quadrature or some other means to achieve a non-ambiguous output is required. An advantage of this technique is that the light can be guided from the light source to the sensor crystal using standard single-mode (SM) or multi-mode (MM) fibers—i.e. no polarization-maintaining (PM) fibers are needed. The polarizers required to obtain the linear polarization for the measurement can be incorporated into the sensing element. Likewise, the return fiber to the detector can be a non-PM fiber.

For voltages much lower than the crystals' half-wave voltage, another polarimetric technique is published in [13]. This technique is particularly suitable for measurements using local field sensors. These sensors only measure a fraction of the total line voltage much smaller than the voltages measured with full integration.

A technique for the retrieval of the electro-optic phase shifts based on non-reciprocal phase modulation is known from fiber-optic gyroscopes [14] and has also been described for fiber-optic current sensors [15]. It has been adapted for use with piezo-electric and electro-optic voltage sensors [16, 17]. It is particularly suitable for small phase shifts, but in general requires the use of PM fibers for the link between an optical phase modulator—generally located near the light source and detector—and the sensing element positioned in the high voltage insulator.

Another concept is known from high-voltage bushings. There is often a need in high-voltage systems to pass high-voltage conductors through or nearby other conductive parts that are at ground potential (e.g., at power transformers). For this purpose, the high-voltage conductor is contained within a feed-through insulator. The insulator contains several layers of metal foil concentric with the high-voltage conductor and insulated from each other. By appropriately choosing the length of the individual cylinders of metal foils, the distribution of the electric field within and near the bushing can be controlled in such a way that a relatively homogeneous voltage drop from high-voltage to ground potential occurs along the outer surface of the bushing [18, 19].

SUMMARY

An exemplary embodiment of the present disclosure provides a high-voltage sensor for measuring a voltage between a first contact point and a second contact point. The exemplary high-voltage sensor includes an insulator composed of an insulating material extending along an axial direction between the first and second contact points. The insulator includes a sensing cavity. The exemplary high-voltage sensor also includes a plurality of conductive electrodes arranged in the insulator, where the conductive electrodes are mutually separated by the insulating material and capacitively coupled to each other. In addition, the exemplary high-voltage sensor includes at least one electric field sensor arranged in the sensing cavity of the insulator. For at least part of the conductive electrodes, each conductive electrode axially overlaps at least one other one of the conductive electrodes. The conductive electrodes are configured to generate an electric field in the sensing cavity having a mean field strength larger than a voltage divided by a distance between the first and second contact points. The at least one electric field sensor is a local electric field sensor configured to measure the field over only part of an axial extension of the sensing cavity. The exemplary high-voltage sensor also includes at least a first primary electrode electrically connected to the first contact point and a second primary electrode electrically connected to the second contact point. The conductive electrodes form a capacitive voltage divider between the first and second primary electrodes.

BRIEF DESCRIPTION OF THE DRAWINGS

Additional refinements, advantages and features of the present disclosure are described in more detail below with reference to exemplary embodiments illustrated in the drawings, in which:

FIG. 11 shows a configuration for detection using nonreciprocal phase modulation with a single optical field sensor according to an exemplary embodiment of the present disclosure;

FIG. 12 shows a configuration using nonreciprocal phase modulation with a single optical field sensor incorporating a 90° rotation of the PM fiber axes according to an exemplary embodiment of the present disclosure;

FIG. 13 shows configurations for nonreciprocal phase modulation detection using multiple crystals: (*a*) sensing elements positioned in the same fiber segment, (*b*) crystals positioned in two different fiber segments with fibers rotated by 90°, (*c*) crystals positioned in two different fiber segments and oriented anti-parallel with respect to each other, (*d*) reflective coating or mirror directly added to crystal end instead of fiber end, according to an exemplary embodiment of the present disclosure;

FIG. 14 shows a configuration for nonreciprocal phase modulation detection using multiple electro-optic (EO) crystals in a modular configuration according to an exemplary embodiment of the present disclosure;

FIG. 16 shows a configuration with vibration compensation, where the orientation of the electro-optic axes of the crystals is depicted by the letter z and the numbers 1 and 2, and the two orthogonal polarizations are shown by the solid and dashed arrows, according to an exemplary embodiment of the present disclosure.

DETAILED DESCRIPTION

Figure 1:
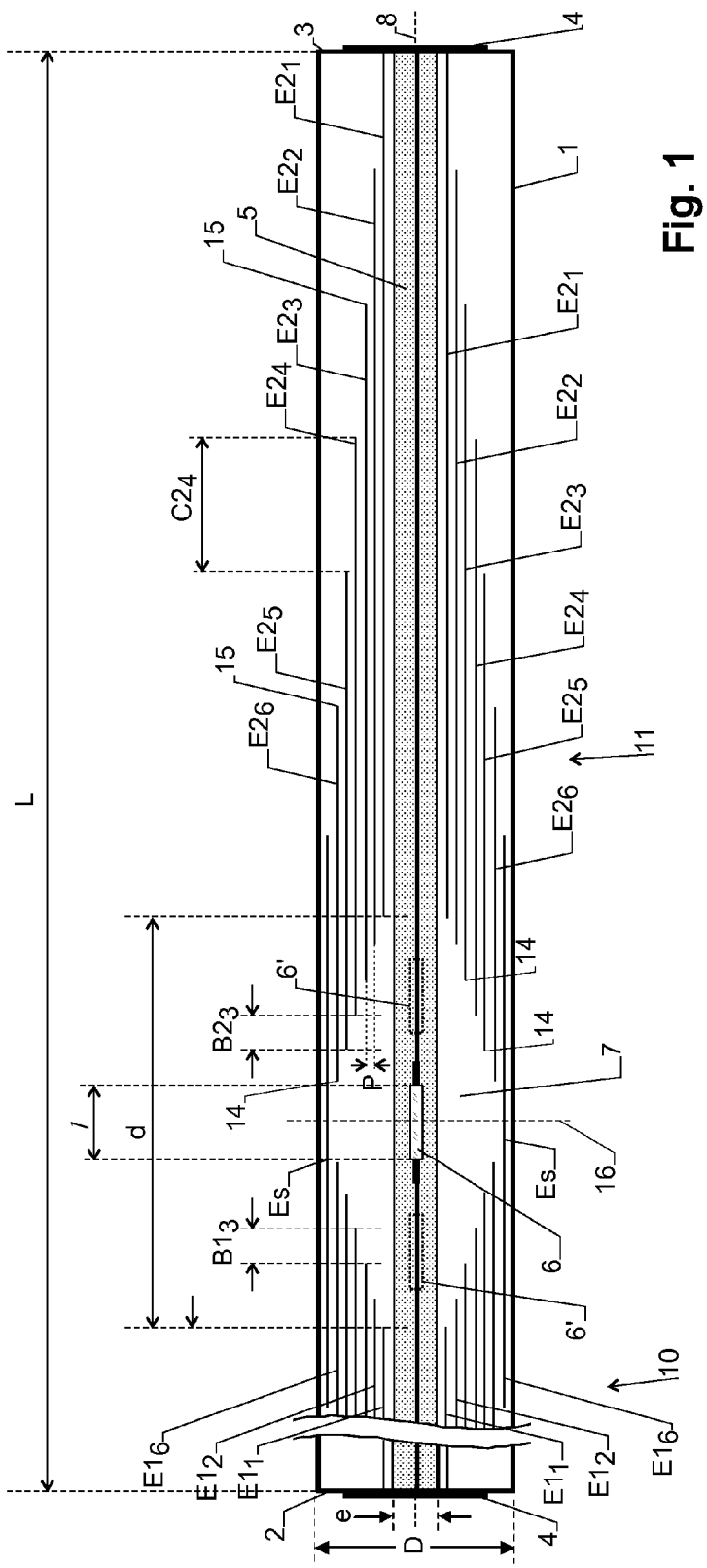
FIG. 1 is a sectional view of a voltage sensor according to an exemplary embodiment of the present disclosure.

Exemplary embodiments of the present disclosure provide a voltage sensor for measuring a voltage between a first contact point and a second contact point of alternative design.

An exemplary embodiment of the present disclosure provides a high-voltage sensor for measuring a voltage between a first contact point and a second contact point. The exemplary high-voltage sensor includes an insulator. The insulator is elongate and extends along an axial direction between the first and the second contact points. An electric field sensor is arranged within a sensing cavity inside the insulator. In accordance with an exemplary embodiment, the length of the sensing cavity is significantly shorter than the length of the insulator. Further, a plurality of conductive electrodes are arranged in the insulator. The conductive electrodes are mutually separated by the insulating material and capacitively coupled to each other. At least a subset of the conductive electrodes (or the whole set of the electrodes) is arranged such that each conductive electrode of the subset axially overlaps at least another one of the electrodes from the subset.

The conductive electrodes allow to control the surfaces of electric equipotential such that on the outer surface of the insulator the voltage drops over the full length of the insulator while inside the insulator the voltage drops over the (shorter) length of the sensing cavity. In accordance with an exemplary embodiment, the voltage drops essentially homogeneously both along the outer surface of the insulator and over the length of the sensing cavity.

Whereas in the absence of the voltage sensor the normal to the surfaces of equipotential is essentially parallel to the axial direction, the normal is perpendicular to the axial direction in the vicinity of the electrodes if such electrodes are present.

The conductive electrodes allow for the concentration of the electric field within the sensing cavity with a field strength larger than the (average) field strength at the outside of the voltage sensor, for example, larger than the voltage between the contact points divided by the distance between the contact points.

At least one electric field sensor is a local electric field sensor in the sense that it measured the field over only part of an axial extension of the cavity. This design obviates the need to use a large field sensor.

In accordance with an exemplary embodiment, the at least one field sensor is an optical field sensor introducing a field-dependent phase shift $\Delta\phi$ between a first sensor polarization or sensor mode and a second sensor polarization or sensor mode of light passing through it. Such an optical field sensor can, for example, be an electro-optical device with field-dependent birefringence, for example, a crystal (e.g. BGO or BSO) or a section of a poled waveguide. The optical field sensor can, however, also be a piezo-electric device, for example, of crystalline quartz or a piezoelectric ceramic and a waveguide carrying at least two modes, with the waveguide being connected to the piezo-electric device such that the length of the waveguide is field-dependent.

In accordance with an exemplary embodiment, at least one of the electrodes is a shield electrode radially surrounding the sensing cavity. The shield electrode can be capacitively coupled to two subsets of electrodes and it prevents the high electric field within the sensing cavity from extending into the air outside the sensor.

In accordance with an exemplary embodiment, the voltage sensor includes two sets of mutually staggered conductive electrodes.

The present disclosure in its exemplary embodiments provides a high-voltage sensor with a slender and light-weight insulator of low cost. The electrodes provide electric field steering. A solid-state insulation may suffice (no oil or gas).

The present disclosure also relates to an assembly of such high-voltage sensors in series. A combination of several modules of the same high-voltage sensor can be used for measuring a large range of different voltage levels.

Additional features of exemplary embodiments of the present disclosure are described in more detail below.

DEFINITIONS

The term "high voltage" designates voltages exceeding 10 kV, for example, exceeding 100 kV.

The terms "radial" and "axial" are understood with respect to the axial direction (along axis 8, z-axis) of the sensor, with radial designating a direction perpendicular to the axial direction and axial designating a direction parallel to the axial direction.

A given electrode "axially overlapping" another electrode indicates that there is a range of axial coordinates (z-coordinates) that the two electrodes have in common.

Voltage Sensor with Electric Field Steering

FIG. 1 shows an exemplary embodiment of a voltage sensor. Instead of using a permittivity shielding [8] or resistive shielding [9], the present embodiment includes an elongated, for example, rod-shaped body with a hollow core, which body is of an insulating material forming an insulator 1, such as epoxy resin or paper impregnated with epoxy resin. It extends between a first contact point 2 and a second contact point 3, both of which may be equipped with metal contacts 4 for contacting neighboring voltage sensors or voltage potentials. In the present embodiment insulator 1 is cylindrical. It has a central bore 5 filled with a filler material.

At least one electric field sensor 6, in the present embodiment an optical field sensor, such as a cylinder-shaped crystal of Bi4Ge3O12 (BGO) or Bi4Si3O12 (BSO), is placed inside bore 5 within a sensing cavity 7. In accordance with an exemplary embodiment, sensing cavity 7 can be at a center between first contact point 2 and second contact point 3 in order to minimize the distortion of the electrical field around the voltage sensor.

A reference plane 16 perpendicular to axis 8 of the device and arranged at the center of sensing cavity 7 is used in the following as geometric reference for describing the geometry of some of the electrodes. Note: Here it is assumed that sensing cavity 7 is located in the middle between contact points 2 and 3. Asymmetric positions of sensing cavity 7 will be briefly considered further below. Further, it is noted that the term "cavity" does not imply that there is an absence of insulating material in the respective region.

A plurality of electrodes E is arranged in insulator 1. The electrodes E are mutually separated by the insulating material of insulator 1 and capacitively coupled to each other. In the present embodiment, the electrodes E are formed by a metallic spiral (consisting e.g. of thin aluminum foil) forming shells of different axial extensions concentric to longitudinal axis 8. The electrodes E control the surfaces of equipotential and the distribution of the electric field outside and inside insulator 1. The lengths (i.e. axial extensions) of the individual electrodes E and their radial and axial positions are chosen such that the surfaces of equipotential are spaced essentially equidistantly along the full length of the outer surface of insulator 1 and are concentrated, but again with essentially equal distances, in sensing cavity 7. As a result the applied voltage V drops uniformly along the outer rod surface as well as along the sensing cavity. In accordance with an exemplary embodiment, the axial length l of the field sensor is much smaller, e.g. at least 5 times smaller, than the axial length d of the cavity. For example, the length of sensing cavity 7 is in the range of 100-250 mm. The volume of central bore 5 outside cavity 7 is essentially field-free.

At least one of the electrodes E is a shield electrode Es and radially surrounds sensing cavity 7, thereby capacitively coupling the two sets of electrodes that are separated by reference plane (16).

One electrode, designated E11, is electrically connected to first contact point 2, and subsequently called the "first primary electrode". Another electrode, designated E21, is electrically connected to second contact point 3, and subsequently called the "second primary electrode". These two electrodes carry the potential of the contact points 2 and 3, respectively. The other electrodes are on floating potential and form a capacitive voltage divider between the two primary electrodes and therefore are at intermediate potentials.

In addition to shield electrode Es, the electrodes include a first set of electrodes, named $E1_i$ with i=1 ... N1, and a second set of electrodes, named $E2_i$ with i=1 ... N2. For symmetry reasons, N1 may be equal to N2. In the exemplary embodiment of FIG. 1, N1=N2=6, but the actual number of electrodes may vary.

The electrodes $E1_i$ of the first set are arranged in a first region 10 of insulator 1, which extends from the center of sensing cavity 7 to first contact point 2, while the electrodes $E2_i$ of the second set are arranged in a second region 11 of insulator 1, which extends from the center of sensing cavity 7 to second contact point 3.

Electrode $E1_1$ of the first set of electrodes forms the first primary electrode, and electrode $E2_1$ of the second set forms the second primary electrode. These electrodes are radially closest to longitudinal axis 8, with the other electrodes being arranged at larger distances from longitudinal axis 8.

As mentioned above, the various electrodes overlap in axial direction and are of a generally "staggered" design. In accordance with an exemplary embodiment, one or more of the following characteristics are used:

a) For each set j (j=1 or 2) of electrodes, the electrodes $Ej_i$ and $Ej_{i+1}$ axially overlap along an "overlapping section". In this overlapping section, the electrode $Ej_{i+1}$ is arranged radially outside from the electrode $Ej_i$.

b) For each set j of electrodes:

Each electrode has a center end (as illustrated by reference number 14 for some of the electrodes in FIG. 1) facing reference plane 16 of the sensor and a contact end (as illustrated by reference number 15) axially opposite to center end 14.

Center end 14 of electrode $Ej_{i+1}$ is closer to reference plane 16 than center end 14 of the electrode $Ej_i$, and contact end 15 of electrode $Ej_{i+1}$ is closer to reference plane 16 than contact end 15 of the electrode $Ej_i$, hence electrode $Ej_{i+1}$ is shifted towards the center as compared to electrode $Ej_i$.

Contact end 15 of the electrode Eji+1 has an axial distance $Cj_i$ from contact end 15 of the electrode $Ej_i$, and center end 14 of electrode $Ej_{i+1}$ has an axial distance $Bj_i$ from center end 14 of electrode $Ej_i$.

The electrodes $Ej_i$ and $Ej_{i+1}$ axially overlap between contact end 15 of electrode Eji+1 and center end 14 of electrode $Ej_i$.

c) The distances $Bj_i$ and $Cj_i$ can be optimized according to the desired field design. For example, to obtain a stronger field within sensing cavity 7 than outside the voltage sensor, the axial distance $Bj_i$ can be chosen to be smaller than the corresponding axial distance $Cj_i$, for all i and j.

d) For most designs, if a homogeneous field is desired in sensing cavity 7, the axial distances Bji should be substantially equal to a common distance B, for example, they can all be the same. Similarly, if a homogeneous field is desired at the surface and outside the voltage sensor, the axial distances $Cj_i$ can be substantially equal to a common distance C, for example, they are also all the same.

e) Shield electrode Es can have an axial overlap with at least one electrode of the first set and also with at least one electrode of the second set. This, on the one hand, provides improved protection against the high electrical fields in sensing cavity 7 reaching the surface of the device. On the other hand, it provides good capacitive coupling between the two sets of electrodes via the shield electrode, thereby decreasing the corresponding voltage drop. To further improve this capacitive coupling as well as the field homogeneity within sensing cavity 7, shield electrode Es can have an axial overlap with the radially outmost electrode E16 of the first set and the radially outmost electrode E26 of the second side and is arranged radially outside from these outmost electrodes E16 and E26.

f) In order to evenly distribute the fields outside and inside the voltage sensor, the electrodes can be arranged symmetrically with respect to reference plane 16 of the device.

g) For the same reason, the electrodes can be cylindrical and/or coaxial to each other, for example, coaxial with the longitudinal axis 8.

FIG. 1 further illustrates some other advantageous aspects:

Field sensor 6 (which is, for example, an electro-optical crystal) can be cylindrical with a length l and is positioned in central bore 5 (diameter e) of insulator 1 (outer diameter D and length L), and within sensing cavity 7.

Insulator 1 contains, as an example, six electrodes in both the first and the second set. These electrodes $Ej_i$, as well as shield electrode Es, can be of a metal foil, concentric with field sensor 6 and insulator 1.

With $Bj_i$ and $Cj_i$ chosen as described above, in accordance with an exemplary embodiment, the electrodes of the two sets are equally spaced in radial direction with a uniform separation distance P between neighboring electrodes, and also the radial distance between the outmost electrode E16, E26 of each set and shield electrode Es is equal to P. Again, this contributes to distribute the electrical fields more evenly both inside and outside insulator 1.

In accordance with an exemplary embodiment, shield electrode Es is positioned at mid-distance between the contact ends 2, 3.

The primary electrodes E11 and E21 are in contact with the two electric potentials, for example, ground and high-voltage potentials, at the corresponding contact points 2, 3 by means of the metal contacts 4.

In accordance with an exemplary embodiment, insulator 1 is equipped with sheds, for example, composed of silicone, on its outer surface, which provide increased creep distance between high-voltage and ground potential for outdoor operation.

The field steering by the electrodes $Ej_i$ and Es avoids excessive local peak fields both outside and inside insulator 1. As a result, the radial dimensions of insulator 1 can be relatively small without the danger of electric breakdown in the environmental air.

In an exemplary configuration, the bore is filled with a solid but compressible filler material that provides sufficient dielectric strength and good adhesion to the epoxy surface as well as to the local field sensors. Good materials can include polyurethane foam containing tiny gas bubbles (e.g., $N_2$ or $SF_6$ gas) and silicone containing expandable thermoplastic micro-spheres. When filling the bore at room temperature, the filler material may have to be inserted with a slight overpressure to assure the shrinkage of the filler at low temperatures does not cause detachment from the insulator walls which could lead to flashovers inside the bore. As mentioned, the filler material may additionally serve to fix the position of field sensor 6 and provide damping of mechanical shock and vibration. In another exemplary configuration, a liquid (e.g., transformer oil) or gas (e.g., $N_2$, $SF_6$) can be used or the remaining volume can be evacuated.

Due to its light weight, the voltage sensor may be suspension-mounted in a high-voltage substation.

The dimensions of the voltage sensor and its parts depend on the rated voltage and are chosen such that the sensor meets the requirements of relevant standards for over-voltages, lightning and switching impulse voltages. For example, insulator 1 of a 125 kV-module may be an epoxy rod having an overall length of about 1 to 1.5 m and a diameter of 50 to 80 mm. The inner bore 5 of the rod may then have a diameter between 15 and 25 mm. The parameters a, Bij, $Ci_j$, D, P are chosen such that the voltage applied to the rod ends drops as uniformly as possible over the length of the crystal within the bore and the full length of the epoxy rod at its outer surface. The design may be optimized by using an adequate numerical electric-field simulation tool.

Choosing the distances $Bi_j$ as well as $Ci_j$ to be equal as described above also contributes to simple and cost efficient insulator fabrication.

Besides facilitating the full integration of the electric field, the capacitive field steering described here represents an efficient way of shielding the internal field geometry from outside perturbations. In accordance with an exemplary embodiment, the insulator capacitance is significantly larger than environmental stray capacitances to maximize the shielding effect. The design thus enables relatively precise measurement of the applied voltage with local electric field sensors. This leads to a cost effective solution due to the reduced size of the local electric field sensors. Moreover, the use of integrated-optic waveguide sensors becomes possible.

Figure 2:
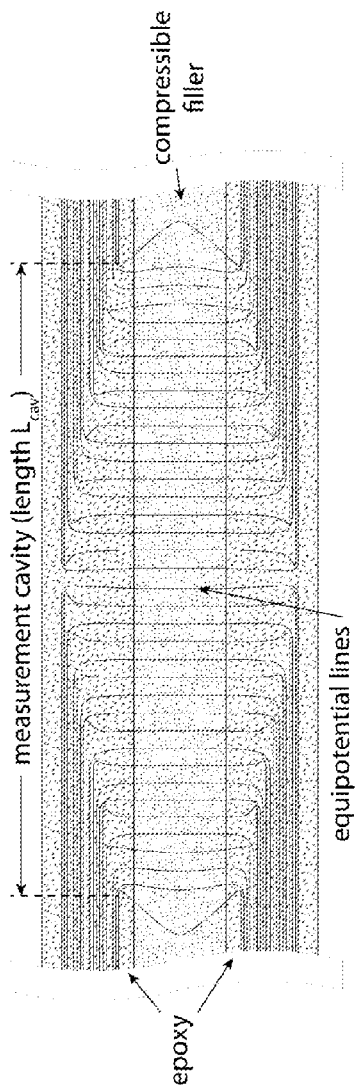
FIG. 2 shows the calculated equipotential lines inside the measurement cavity (the field steering electrodes are omitted), according to an exemplary embodiment of the present disclosure.
Figure 3:
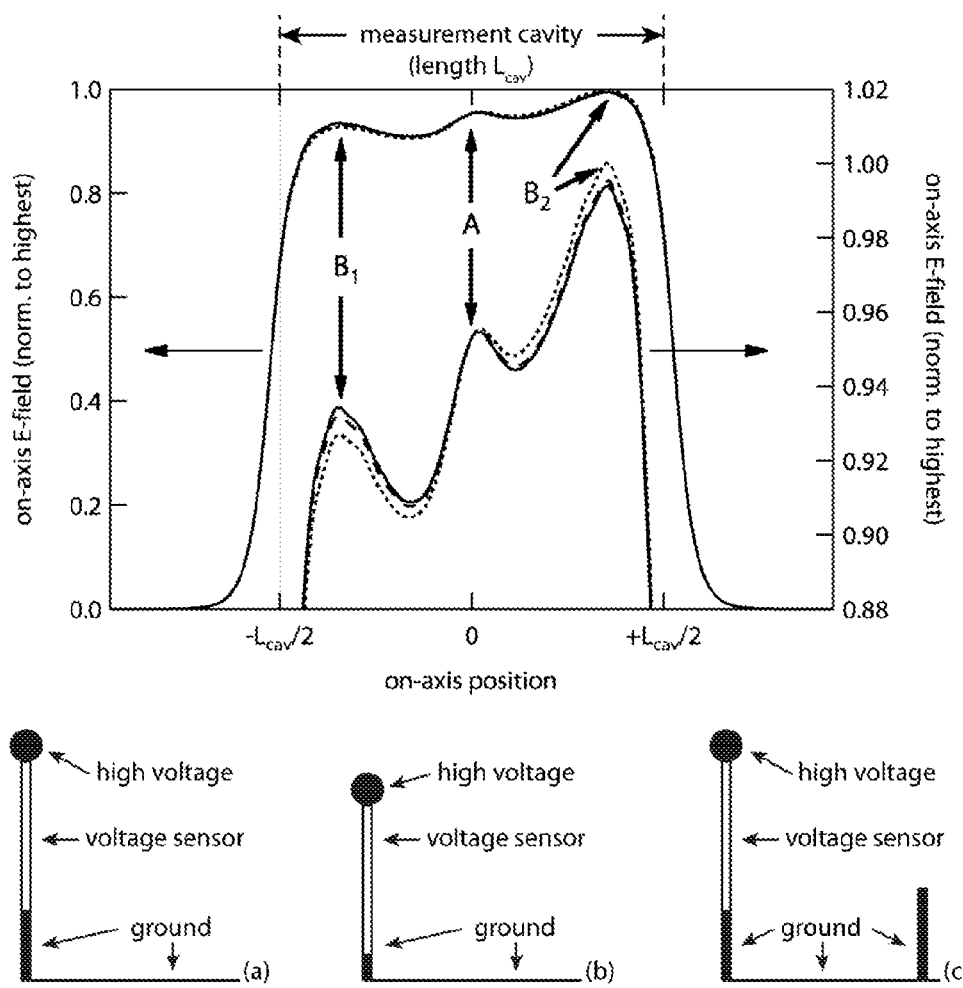
FIG. 3 shows the relative field strength along the axial direction inside the measurement for three different boundary conditions according to an exemplary embodiment of the present disclosure.

Numerical field calculations reveal that the voltage drop inside the cavity 7 is relatively homogeneous, see FIGS. 2 and 3. FIG. 3 shows the calculated relative field strength along the insulator axis inside the measurement cavity with length d=Lcav. The zero position denotes the center of the cavity 7. The three curves correspond to three different boundary conditions shown below: (a) voltage sensor on long grounded post (solid curve), (b) on short grounded post (dotted curve), (c) on long grounded post with grounded construction in vicinity (dashed curve). The letter A depicts a location where the electric field is particularly stable. The measurement of a local field sensor at this position will show a very low sensitivity to the external perturbations mentioned above. A local field sensor can be placed at such a position. Hence, if cavity 7 is symmetric to reference plane 16, at least one field sensor can be arranged symmetrically to reference plane 16 and is intersected by the same, for example, it is located at point A.

Alternatively or in addition thereto, multiple local field sensors, for example, two local field sensors, can be positioned at different locations inside the measurement cavity such that, when adding the measured fields, the effects of external perturbations cancel each other (e.g. points B1 and B2 in FIG. 3). Suitable locations and their stability with respect to external perturbations may depend on the boundary conditions and their variation during operation of the voltage sensor and must thus be analyzed for a particular application.

For example, if cavity 7 is symmetric to reference plane 16, a plurality of the field sensors 6 can be arranged symmetrically with respect to the reference plane, such as shown for the field sensors 6' depicted in dotted lines in FIG. 1.

In more general terms, the position of the at least one field sensor 6 is symmetrical to reference plane 16. This statement indicates that if there is a single field sensor 6, the position of the field sensor coincides with reference plane 16. If there are several field sensors 6, their positions are symmetric to reference plane 16, that is, the positions are invariant under a mirroring operation in reference plane 16.

FIG. 1 illustrates but one possible design of the electrodes. It must be noted that, depending on the required size and shape of the sensor, the design of the electrodes may vary.

For example, the electrodes may also be non-cylindrical, for example, by having an oval cross section or by having varying diameter. The electrodes may, for example, be frustoconical, their end sections 15 may be flared outwards or their end-sections 14 may be flared inwards.

Each electrode can include a continuous conductive sheet, such as a metal foil, or it may, for example, be perforated or have gaps.

Assembly of Several Voltage Sensors

Figure 4:
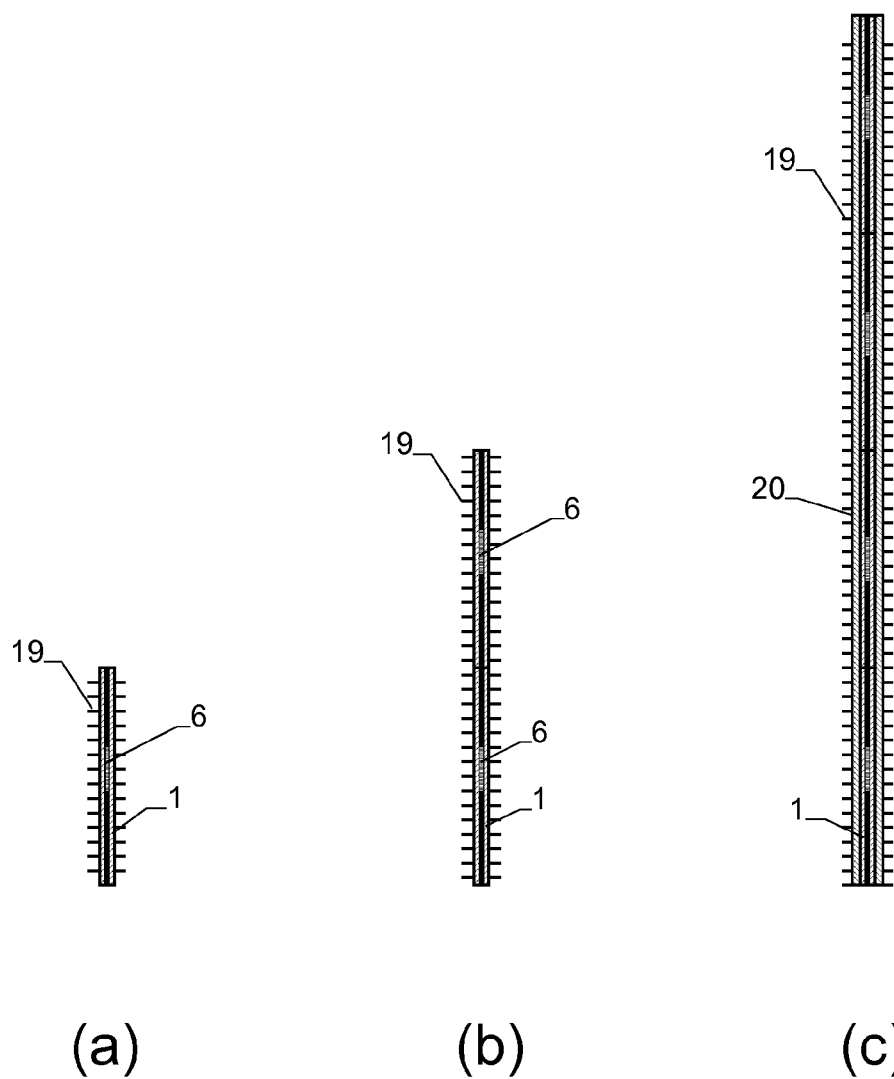
FIG. 4 shows (*a*) a single voltage sensor as well as assemblies of two (*b*) and four (*c*) voltage sensors according to an exemplary embodiment of the present disclosure.

The voltage sensor described above may form a module in an assembly of several voltage sensors arranged in series. One such module is shown in FIG. 4a. For example, a module containing a single field sensor 6 as described above may be designed for a rated voltage of e.g. 125 kV or 240 kV. FIG. 4a also shows schematically the sheds 19 applied to the outside of insulator 1.

For operation at 240 kV, two 125 kV modules may be mounted in series (FIG. 4b). The primary electrodes E21 and E12 of the neighboring modules are in electric contact at the joint between the two modules. The voltage is then about evenly partitioned on the two field sensors 6 (Note: in practice, the voltage ratio will be affected to some degree by environmental stray capacitances). Alternatively, a single continuous insulator (with a length of about twice the length of the individual rods) which contains two field sensors 6 and two corresponding assemblies of field steering electrodes may be used instead of two separate epoxy rods.

FIG. 4c shows an assembly of four modules.

It should be noted that distributing the voltage on two or more separate crystals of length l results in a smaller insulator diameter and thus lower insulator cost than applying the same voltage to a single crystal of length 2l.

Field Sensor Assembly

In the exemplary embodiment of FIG. 1, the field sensor 6 is substantially suspended by the filler material in bore 5.

Figure 17:
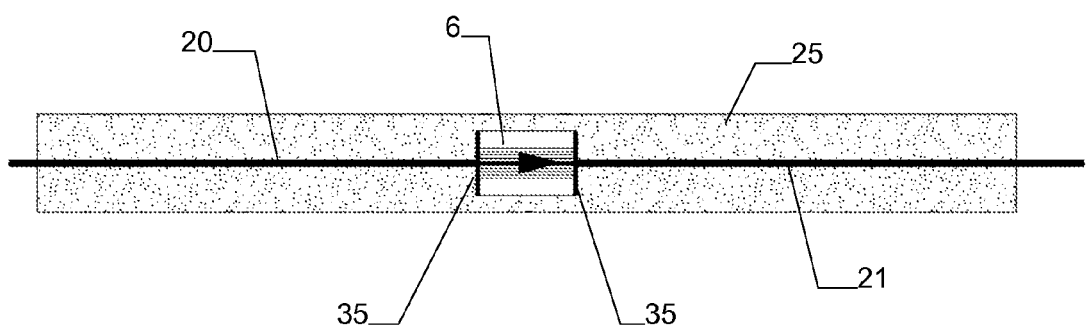
FIG. 17 shows a field sensor on a dielectric substrate according to an exemplary embodiment of the present disclosure.

Alternatively, the field sensor 6 may be attached to a dielectric substrate or be embedded into such a substrate, for example, the high-voltage sensor includes a dielectric substrate arranged in cavity 7 and holding field sensor 6. For example, as shown in FIG. 17, a suitable substrate 25 may have the shape of a beam with, for example, a cylindrical or square cross section extending axially through the cavity 7 to substrate mounts in the field-free zones of the insulator bore 5. The substrate may be made, for example, from fused silica or from the same material as the sensing element itself or from a combination of several materials. The substrate may also extend through the whole insulator bore 5 to mounts at the two insulator ends. Furthermore, the fibers 20, 21 to and from the sensing element may be embedded into the substrate 25 in a way that the sensing element, the fibers, and the substrate form an integral device which can be inserted as a whole into insulator bore 5. Such a configuration can be designed to reduce steps in the dielectric constant at the boundaries between the ends of the local field sensors and the filler material.

In accordance with an exemplary embodiment, field sensor 6 is an embedded electro-optic crystal waveguide with a polarizing layer 35 at its input surface and a quarter wave retarder 24 and a polarizing layer 35 at its output surface in case of polarimetric detection (assuming the field sensor 6 is essentially free of birefringence). Alternatively, the polarizing layers are not required for detection using nonreciprocal phase modulation as described further below. Here polarization maintaining fibers to and from the crystal waveguide are used instead.

In accordance with an exemplary embodiment, for minimizing field distortions, field sensor 6 has the same (average) permittivity as substrate 25.

Local Field Measurement

As the field distribution inside the sensing cavity is rather homogeneous and stable (see FIG. 3), a local (i.e. essentially point like) electric field measurement, for example at the center of cavity 7, can be used as described above. A local electric field sensor in this sense is a sensor that measures the electric field along only part of the axial extension of the cavity 7. The local field essentially varies in proportion to the applied voltage. The influence of thermal effects on the local field strength, e.g. due to the thermal expansion of sensing cavity 7, may be compensated in the signal processor and/or using the measures described below.

In accordance with another exemplary embodiment, as also mentioned, the voltage may be approximated from several local (point like) field measurements, with the local field sensors arranged at several points within cavity 7 along axis 8. For example, such an arrangement can be of advantage if the length of sensing cavity is chosen relatively long. Such an arrangement may also be of interest in case rather high voltages (e.g. 420 kV or higher) are to be measured with a single voltage sensor module.

Furthermore, a combination of several electro-optic crystals with inactive material (such as fused silica) in between as described in [10] and interrogated by a single light beam may be employed.

Compensation of Thermal Effects

The relation between the local field at the field sensor 6 and the voltage applied to the insulator needs to be known in order to determine the voltage. This relationship can be determined either by field calculations or by appropriate calibration of the sensor. The field geometry must be sufficiently stable such that this relationship does not change significantly under external influences such as electric field perturbations and temperature changes. A change in temperature, for example, alters the relative permittivities $\in_r(T)$ of the various materials and leads to a thermal expansion of the components. In accordance with an exemplary embodiment, the length of the measurement cavity expands more strongly than does the electro-optic crystal, because the thermal expansion coefficient of the insulator material ($\sim 5 \cdot 10^{-5}/°$ C.) is larger than that for typical electro-optic crystals (e.g. $6 \cdot 10^{-6}/°$ C. for BGO). As a consequence, the fraction of the voltage seen by the crystal is reduced. This effect is partly compensated for certain advantageous crystals where the strength of the electro-optic effect increases with increasing temperature (e.g. $2.4 \cdot 10^{-4}/K$ for BGO [3]). With a suitable combination of used materials and sensor geometry the effects of temperature can be reduced or even compensated and sensor precision can thus be maintained over a large temperature range.

In general, the electric field distribution inside the sensing cavity, and in particular the distribution of the electrical field component in axial direction Ez, will vary with temperature as a consequence of the temperature dependence of the various coefficients of thermal expansion and of the relative permittivities. The mean axial electrical field component Ez,mean in the local field sensor 6 becomes temperature-dependent as well, i.e. $\partial Ez,mean/\partial T \neq 0$. This temperature dependency which leads to a deviation of the measured voltage can be partly compensated by proper choice of local field sensor geometry and an electro-optic material where the temperature derivative of the electro-optic effect of the sensor has the opposite sign, resulting in a temperature-dependence of the field-dependent phase shift $\partial \Delta\phi/\partial T$ close to zero.

Optical Sensor Configurations for Local Field Measurement

The voltage applied to the insulator is measured by determining the electric field at one or multiple locations inside the measurement cavity 5 using local electric field sensors. An exemplary sensing technique used for the local electric field measurement is based on the electro-optic effect (Pockels effect). Two orthogonal polarizations experience a differential phase shift when propagating through an appropriately oriented electro-optic crystal in an electric field. The voltage applied to the crystal is then inferred from this phase shift. The light is guided from the source to the crystal and back to a detector by means of optical fibers.

In accordance with an exemplary configuration, a suitable electro-optic crystal is chosen and oriented such that only the axial component Ez of the electric field is measured. If the light propagates axially through the crystal, this is the component of the electric field pointing in the propagation direction of the light. Such an electro-optic field sensor measures the voltage difference between the two crystal ends by integration of the projection of the electric field onto the optical path given by $$V = \int_A^B E \cdot ds, \quad (1)$$

where A an B are the points on the optical path where the light enters and exits the crystal, E is the electric field vector and ds is an infinitesimal path element vector along the optical path.

Ideally, the used crystal has no intrinsic birefringence or it is such that the axes of the intrinsic birefringence coincide with the principle electro-optic axis. In the latter case, the intrinsic birefringence simply adds to the induced birefringence and results in an additional phase offset of the orthogonal polarizations. Information on appropriate crystals and crystal classes can be found in [3]. Exemplary crystals for the present voltage sensor include bismuth germanate (Bi4Ge3O12, BGO), bismuth silicon oxide (Bi4Si3O12, BSO), and III-V-semiconductors, in particular gallium arsenide (GaAs). III-V-semiconductors can be used because they have lower permittivity $\in$ than typical ferroelectric electro-optical crystals and therefore lead to lower field distortions within cavity 7.

GaAs modulators are of particular interest and may be adapted for use according to the present disclosure, in particular as a waveguide sensor. GaAs belongs to the same crystal class as BGO (class 43m) and is also suited to exclusively measure the longitudinal field component. Furthermore, the dielectric permittivity of GaAs ($\in=12.9$) is relatively small so that a substantial fraction of the field penetrates into the crystal.

Polarimetric Detection

Figure 5:
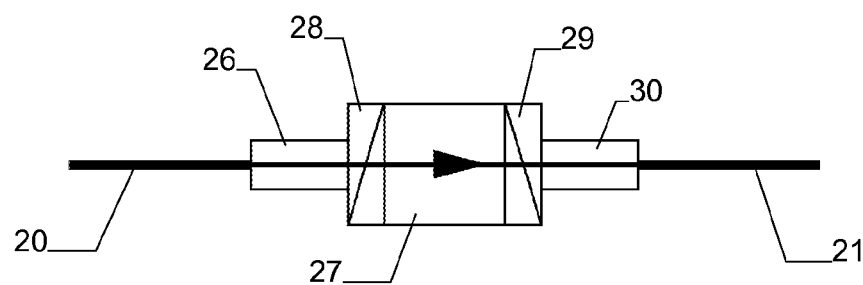
FIG. 5 shows a sensing assembly for a collimated beam in a bulk crystal without quarter-wave plate according to an exemplary embodiment of the present disclosure.

A first sensor arrangement is shown in FIG. 5. The unpolarized light from a broadband source is delivered via SM or MM fiber 20 and collimated using an appropriate collimating lens 26 at the fiber output. Before entering the electro-optic crystal 27, the light is linearly polarized, e.g. by a thin film polarizer 28, with the polarization oriented at 45° to the electro-optic axes of the crystal. Alternatives to a thin film polarizer include polarizing the light using an inline fiber polarizer.

At the end of the crystal 27, the phase shift induced by the applied electric field via electro-optic effect is probed by a polarizer 29 which is, for example, oriented at 0° or 90° relative to the first polarizer 28. It converts the phase modulation in the crystal 27 into an amplitude modulation, which can be measured with a photo diode. For this purpose the light is coupled back into an optical fiber 21 by a focusing lens 30 attached to the polarizer 29. For very short crystals sufficient light can be coupled back into the fiber 21 even without prior collimation and refocusing. In this case the lenses can be removed from the configuration shown in FIG. 5.

Figure 7:
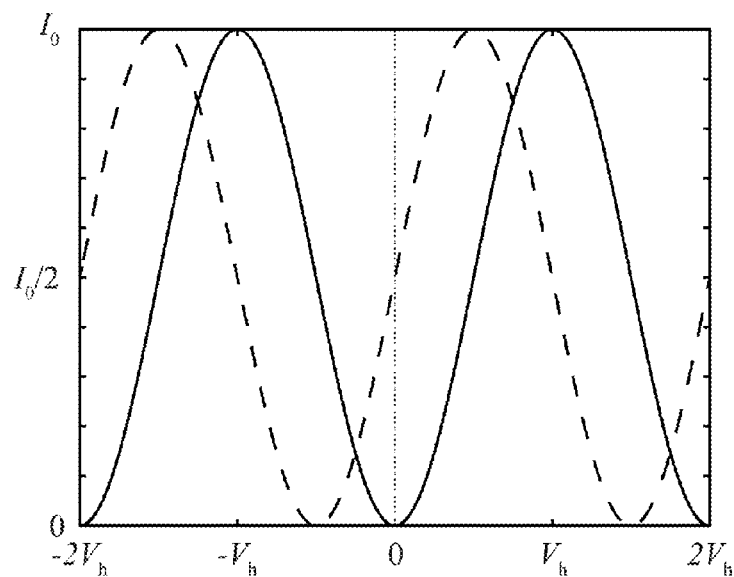
FIG. 7 shows the measured intensity as a function of applied voltage for the sensing assemblies of FIGS. 5 and 6 according to an exemplary embodiment of the present disclosure.

Assuming that the second polarizer oriented at 90° with respect to the first, the detected light intensity is given by $$I(V) = I_0 \sin^2(\Delta\phi(V)/2) = I_0/2 \cdot (1 - \cos(\Delta\phi(V))) \quad (2)$$

where I0 is the intensity incident on the polarizer and V is the voltage applied to the crystal (see FIG. 7). The phase shift $\Delta\phi$ between the two orthogonal polarizations is $$\Delta\varphi(V) = \frac{\pi V}{V_h}, \quad (3)$$

with Vh being the half-wave voltage of the electro-optic crystal. At the half-wave voltage the phase shift between the two orthogonal polarizations is π and the detected light intensity according to (2) reaches its maximum value I0 (assuming no losses at the polarizer itself). FIG. 7 shows the measured intensity as function of the applied voltage of the exemplary embodiment of FIG. 5 (solid line).

Figure 6:
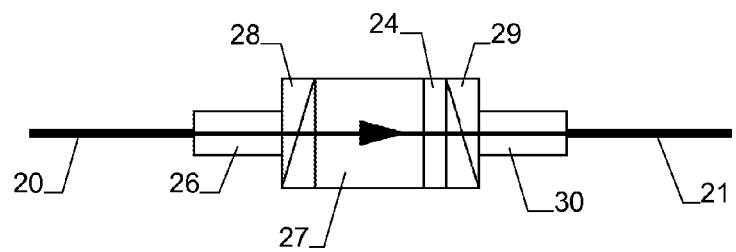
FIG. 6 shows a sensing assembly for a collimated beam in a bulk crystal with quarter-wave plate according to an exemplary embodiment of the present disclosure.

In accordance with an exemplary embodiment, a quarter-wave plate is inserted between the crossed polarizers on either side of the crystal with its optical axis oriented along one of the electro-optic axis of the crystal, as shown in FIG. 6. The quarter-wave retarder 24 shifts the response curve by π/2, such that the detected intensity at zero voltage is in the linear regime of the sinusoidal modulation (see FIG. 7, dashed line). Equation (2) changes to $$I(V)=I_0/2\cdot(1-\cos(\Delta\phi(V)+\pi/2)=I_0/2\cdot(1+\sin(\Delta\phi(V))) \quad (4)$$

Again, after the polarizer a focusing lens refocuses the beam into a single mode (SM) or multi mode (MM) fiber to guide the light to a detector.

According to equations (2) and (4), the measured intensity shows a sinusoidal oscillation as function of the applied voltage. The measured signal becomes ambiguous if the applied voltage exceeds the half-wave voltage. In this case the interrogation method described in [2-4] can be used to unambiguously extract the applied voltage from the measured intensity. The quadrature signal that is required for this interrogation technique can be generated by attaching a beam-splitter and a quarter-wave plate as well as a second detection fiber and detector to the end of the crystal, see Ref [3].

For a local field measurement, the length of the electro-optic crystal can range from less than a millimeter to several centimeters. The appropriate length depends on the applied voltage, the chosen material, and the desired interrogation technique. Since the optical field sensors used in this disclosure only perform a local field measurement, they normally see just a fraction of the total voltage applied to the insulator, and the crystal length can be chosen such that the electro-optic phase shift is much smaller than ±π/2. Using the configuration with quarter-wave plate 24 shown in FIG. 6, the measurement then takes place in the linear regime of the sinusoidal curve leading to a measured intensity approximated by $$I(V)=I_0/2(1+\Delta\phi(V)). \quad (5)$$

Assuming the applied voltage is an ac voltage, the ac and dc components of the signal in (5) can be separated by means of appropriate low and high pass filters. The ratio of these two components yields the phase shift Δϕ(V) independent of the light intensity.

Figure 8:
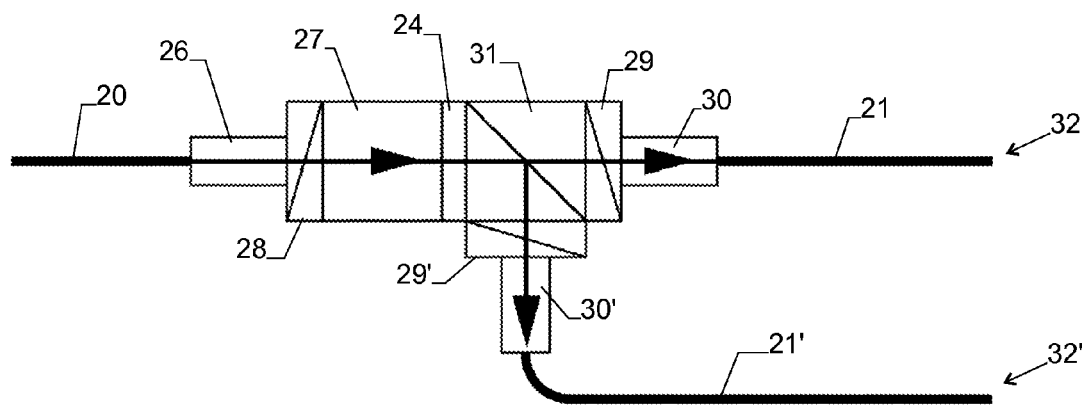
FIG. 8 shows a sensing assembly with a beam splitter according to an exemplary embodiment of the present disclosure.

Alternatively, an interrogation according to [20] can be used: instead of directly attaching the polarizer to the quarter-wave plate 24 as shown in FIG. 6, the beam first is separated by a non-polarizing beam splitter element 31 into two output channels 32, 32' (see FIG. 8). At each output channel a polarizer 29, 29' is attached, such that they probe polarization directions at 90° with respect to each other. After the polarizers the beams are again focused into an SM or MM fiber 21, 21' by means of focusing lenses 30, 30' to be guided by fibers 21, 21' to two detectors. Instead of a non-polarizing beam splitter 31 with polarizers 29, 29' attached one can also use appropriately oriented polarization splitters which separate the beam into two perpendicularly polarized outputs. Examples are polarizing beam splitter cubes, Wollaston prisms, Nomarski prisms, Glan-Thompson prisms, Glan-Taylor prisms, Nicol prisms, etc.

Following from equation (4), the two output channels now measure $$I_{1/2}(V)=I_0/4\cdot(1+\sin(\Delta\phi(V))) \quad (6)$$

where the additional factor of ½ accounts for the beam splitter under the assumption that the splitting ratio is 50:50 and that losses are negligible. Dividing the difference of I1 and I2 by their sum results in a signal independent of the light intensity $$\frac{I_1(V)-I_2(V)}{I_1(V)+I_2(V)}=\sin(\Delta\varphi(V)). \quad (7)$$

In an alternative configuration, the polarizer in one of the output channels (e.g. in channel 2) is omitted and one measures $$I_2=I_0/2 \quad (8)$$

independent of the applied voltage. The division of I1(V) from (6) and I2 again yields a signal independent of the light intensity with which the phase shift and the voltage can be directly calculated.

Figure 9:
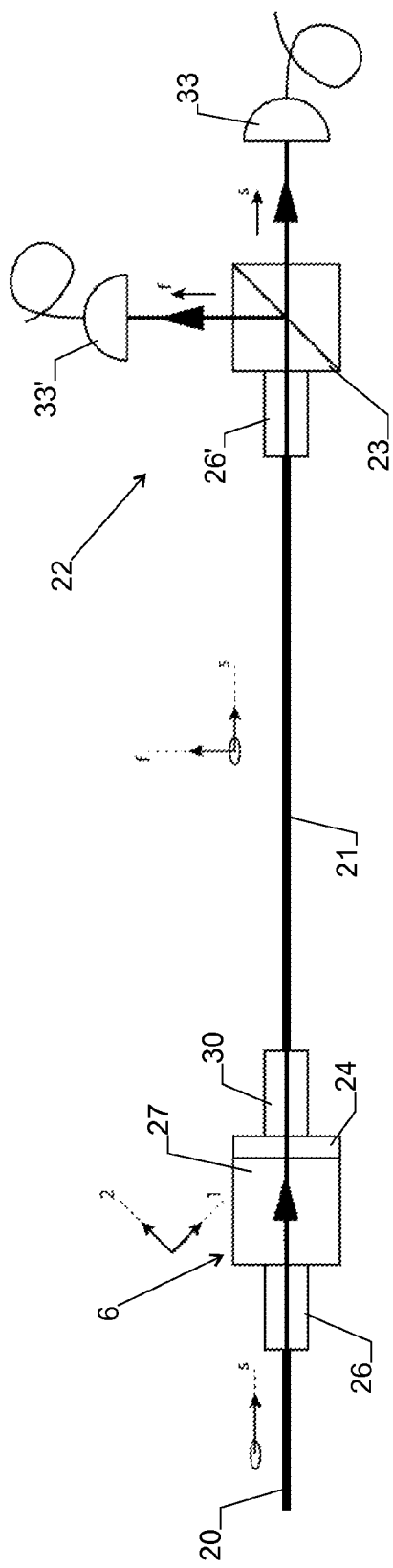
FIG. 9 shows an assembly with a polarization maintaining fiber to allow separating the beam splitter and polarizers from the electro-optic crystal according to an exemplary embodiment of the present disclosure.

Yet another configuration involves the use of polarization maintaining (PM) fibers to allow separating the beam splitter and polarizers from the electro-optic crystal and thereby removing them from the measurement cavity 7. This configuration is shown in FIG. 9. FIG. 9 shows an optical assembly using e.g. a bulk crystal 27 and PM delivery fibers 20, 21. The electro-optic crystal 27 is located in the measurement cavity 7 of the isolator, whereas a detection unit 22 with a polarizing beam splitter 23 is located in the interrogation unit near the light source and electronics.

The light arrives at the crystal 27 polarized along either the fast (f) or slow (s) axis of PM delivery fiber 20. The PM fiber axes of fiber 20 are oriented at 45° to the crystal's electro-optic axes (1, 2) such that the polarization is separated into two orthogonal components. A quarter-wave plate 24 again shifts the working point into the linear regime of the response curve. The axes of the second PM delivery fiber 21 are also oriented at 45° to the crystal axes. With this arrangement the light intensities of the two orthogonal polarization modes of the fiber correspond to the two anti-phase superpositions of the orthogonal polarizations of the electro-optic crystal according to (6). The two signals may be separated at the end of PM delivery fiber 21 by feeding the light from delivery fiber 21 through a collimating lens 26' to a non-polarizing beam splitter and crossed polarizers that are aligned parallel to the fast and slow fiber axes, respectively. Alternatively—as shown in FIG. 9—a polarizing beam splitter 23 may be used to omit the extra polarizers. The beams from the beam splitter are fed to a first and a second detector 33, 33', respectively.

In more general terms, the exemplary embodiment of FIG. 9 includes an optical sensor introducing a voltage-dependent phase shift Δϕ(V) between a first sensor polarization or sensor mode and a second sensor polarization or sensor mode of light passing through it. In accordance with an exemplary embodiment, the device can also include a polarization maintaining fiber (e.g., fiber 21) connected to the optical sensor. This polarization maintaining fiber has at least a first polarization mode, for example, it is able to carry light along at least a first polarization in polarization maintaining manner. The polarization maintaining fiber is connected to the optical sensor (e.g., to the crystal) in such a manner that light passing the optical sensor in the first sensor polarization or sensor mode as well as light passing the optical sensor in the second sensor polarization or sensor mode are both partially coupled into the first polarization mode of the polarization maintaining fiber. The device further includes a detector unit 22 connected to the polarization maintaining fiber. The detector unit 22 includes at least a first light detector (detector #1 or #2 of FIG. 9) measuring light passing through the first polarization mode of the polarization maintaining fiber.

Figure 10:
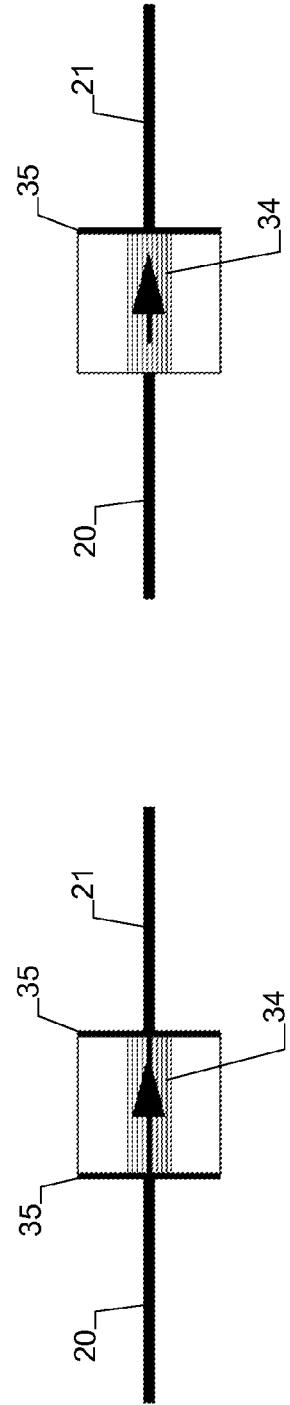
FIG. 10 shows a waveguide optical sensor with two polarizers (*a*) or one polarizer (*b*) according to an exemplary embodiment of the present disclosure.

Instead of propagating an unguided beam through the electro-optic crystal, the beam may be guided by an electro-optic crystal waveguide 34 embedded into the material [12] (see FIGS. 10a and 10b), for example, the optical sensor may be formed by a waveguide. In accordance with an exemplary embodiment, the device implementation is similar to the one of integrated-optic phase modulators that have been developed for use in communication systems [21] and of sensors for mapping of electric field distributions [22]. In contrast to those applications, the waveguide structure for the present purpose is not equipped with electrodes to apply a voltage from an external source, but instead the structure is directly exposed to the electric field to be measured. Such an implementation is of particular interest as it eliminates the need of any focusing optics. Instead, the fibers may be directly pigtailed to the substrate containing the electro-optic waveguide. This simplifies the optical assembly and results in more compact devices. Furthermore, the simpler design also helps to reduce the risk of dielectric breakdown in high electric fields. Another exemplary aspect is that several sensing elements at different locations can easily be linked by PM fibers. The total electro-optic phase shift can then be measured with a single interrogation system as described below.

In the exemplary embodiment of FIGS. 10a and 10b polarizing layers 35 are arranged at least one of the entry and/or exit sides of waveguide 34.

An exemplary waveguide material is GaAs or other suitable compound semiconductors [9] for the reasons mentioned above.

In the configurations according to FIGS. 6 and 9, the quarter-wave retarder 24 and/or polarizer 29 are sandwiched between the substrate of the optic field sensor and the corresponding lens. Instead of using such a discrete quarter-wave retarder, the waveguide itself may give rise to an intrinsic birefringent phase retardation corresponding to an odd multiple of a quarter-wave. Moreover, there are several options to introduce a proper amount of birefringence in case of materials which are free of natural birefringence (e.g. GaAs): (i) commonly a waveguide is not perfectly isotropic and therefore exhibits a certain degree of birefringence. By cleaving or polishing the waveguide to a proper length, the phase retardation may be adjusted to the desired value. (ii) An appropriate amount of birefringence may be introduced by irradiation of the waveguide with highly intense laser pulses [23]. The same procedures can be applied to materials with intrinsic birefringence in order to tune the working point of the sensor into the linear range of the response curve.

Interrogation by Nonreciprocal Phase Modulation

Besides the polarimetric techniques described above, the technique of nonreciprocal phase modulation known from Sagnac interferometers, particularly from fiber gyroscopes [14], can be employed to interrogate the optical electric field sensors. This technique has also been used for fiber-optic current sensors and has been described in the context of optical high voltage sensors [17]. A particular benefit of this technique is that a single interrogation system can be used to measure the accumulated electro-optic phase shift of several sensing elements arranged in series.

Sensor configurations of this type, as shown in FIGS. 11-13, can include a control unit 100 configured to determine the voltage to be measured from the phase shift $\Delta\phi$ between light passing the optical sensor in the first sensor polarization or sensor mode and light passing the optical sensor in the second sensor polarization or sensor mode, a Faraday rotator 101 arranged between control unit 100 and optical sensor 6 and rotating the light passing through it by approximately 45° for each pass. In accordance with an exemplary embodiment, a connecting PM fiber 102 is provided for connecting the control unit 100 with Faraday rotator 102.

As shown in FIG. 11, control unit 100 can include a low-coherence light source 106 followed by a depolarizer and an inline fiber polarizer 107. The following 45° splice 108 results in an equal distribution of the power into fast and slow axis of the subsequent PM fiber. An integrated-optic phase modulator 109, such as a lithium niobate (LN) modulator, serves to modulate the differential phase of the two orthogonal waves. The modulator is part of a closed-loop detection circuit which is used to recover the optical phase shift of the orthogonal light waves introduced by the electric field sensor of the sensor head [5]. The detection circuit includes a detector 114 and a signal processor 113. Control unit 100 is connected to the sensor head 109 by means of PM connecting fiber 102.

Key element of the configuration is the 45° Faraday rotator 101 at the beginning of the sensor head and connected to connecting PM fiber 102. It results in a non-reciprocal rotation of the two forward travelling polarization states of 45° and a full roundtrip rotation of 90°. The forward propagating light polarized along the fast (slow) fiber axis is thus polarized along the slow (fast) axis when returning to the control unit. This ensures that the differential roundtrip group delays attained in the connecting fiber is zero and that phase shifts—caused e.g. by mechanical perturbations or temperature variations—cancel and do not disturb the measurement. Further details on the interrogation technique can be found in [14, 17, 24]

In accordance with an exemplary embodiment, the device can include at least one first and at least one second polarization maintaining fiber section 103, 104 arranged optically in series and connected to guide the light between two passes through Faraday rotator 100. The main axes of the first and second polarization maintaining fibers are mutually rotated by 90°.

The PM fiber section 103 after the 45° rotator is oriented at 45° to the connecting PM fiber 102 such that the polarizations are again aligned along the slow and fast axis of the fiber. The PM fiber in the sensing head 109 is divided into the two sections 103, 104 of equal length which are connected by a 90° splice 110. The second section 104 serves to balance the differential modal group delay and temperature-induced phase changes in the first section 103. More generally, if different types of PM fiber are used in the sensing section, their lengths and orientations are chosen such that the differential optical path length $$\Delta L_g = \sum_i \Delta L_{g,i} = \sum_i (n^s_{g,i} - n^f_{g,i}) l_i \qquad (9)$$

is essentially zero or corresponds to a value much smaller than the coherence length of the low-coherence source. In equation (9), the ng,i denote the group index (ng=c/vg) for the fast (f) and slow (s) axis of the fiber in the corresponding fiber section with length li. The end of the last fiber section in the chain has a reflective coating or a mirror attached such that the light returns to the control unit.

Note: In the special case of PM fibers where the group birefringence ($n_g^s$-$n_g^f$) and thus $\Delta L_g$ is zero at the wavelength of operation one fiber section 103, 104 is sufficient, i.e. a 90° splice is not needed.

A single pass Faraday rotation of 45° (i.e. a roundtrip rotation of 90°) at rotator 101 results in maximum interference fringe contrast (modulation depth) and thus in the highest signal-to-noise ratio. Deviations from 45° reduce the modulation depth and signal-to-noise ratio. The modulation depth becomes zero at rotations of 0°, 90°.

The sensor head further incorporates at least one optical field sensor 6 (see FIG. 11), for example, an electro-optic crystal waveguide 34. If a differential optical path length is caused by this field sensor, it can be taken into account by appropriately adjusting the fiber lengths according to equation (9) such that the overall delay is again zero. Ideally, optical field sensors with a waveguide structure are used in this configuration to avoid the more complex collimating optics needed for the free space configurations described above. The axes of the PM fiber pigtails are oriented parallel to the electro-optic axes.

The light from sensor 6 is fed through a PM fiber 111 to a reflective coating or mirror 112.

In FIG. 12, a configuration is shown where the PM fiber sections 103, 104 at the input and the output of the electro-optic crystal are rotated by 90° with respect to each other. The 90° splice is therefore incorporated in the connection of the fibers to the optical sensor 6 or crystal 27, and an external 90° splice is not necessary.

FIG. 13 shows various configurations with multiple optical field sensors 6 which can e.g. be placed at different locations within measurement cavity 7, or in different measurement cavities arranged in series in the same or in different insulators. In FIG. 13a, the electro-optic crystals 6 are positioned in the same PM fiber section 104 and have the same orientation of the electro-optic axis with respect to the fiber axes. The total field-induced differential phase shift then corresponds to the sum of the electric field strengths at the two crystals.

In FIG. 13b, the crystals 6 are positioned in two different PM fiber sections 103, 104. The crystal orientations in the two sections 103, 104 with respect to the fiber axes differ by 90°, i.e. the electro-optic axis of the crystals oriented along the fast axis of the PM fiber in the first section are oriented along the slow axis of the PM fiber in the second section in order to sum up the field strengths at the two crystals. This is depicted in more detail by the ellipses indicating the axes orientation of the PM fibers and the small numbers indicating the directions of the electro-optic axes of the crystal. For example, the polarization mode indicated by the dashed arrow is oriented along the slow axis in the first PM fiber segment and along the fast axis in the second. In both segments however the mode is polarized along axis 2 of the electro-optic crystal.

Alternatively, the PM fibers can be attached to the crystals with the same relative orientation in both sections 103, 104, provided that the crystal in the second segment is oriented anti-parallel to that in the first segment (see FIG. 13c). In this case the polarization indicated by the dashed arrow is polarized along axis 1 of the electro-optic crystal in the first segment and along axis 2 in the second segment. Because of the anti-parallel orientation of the crystal in the second segment (depicted by the z axis) the resulting differential electro-optic phase shift between the two polarizations has the same sign in both cases.

FIG. 13d shows a similar configuration as FIG. 13a: instead of using a fiber 111 with a reflective fiber end or mirror 112 attached, the electro-optic crystal is coated on one side with a reflective coating. This configuration is also possible with the crystals in two different fiber segments (FIGS. 11b and c), in which case the second crystal is attached to the end of the PM fiber in the second segment.

If a single optical field sensor has to be interrogated, one can omit the PM fibers in the sensing section and directly attach the sensing element to the 45° Faraday rotator, provided the differential phase shift introduced by the sensing element is sufficiently small (see above). The 45° Faraday rotator is then placed inside the measurement cavity together with the sensing element which has a reflective coating at the end (similar to FIG. 13d).

Finally, the configuration shown in FIG. 14 is particularly suitable for use with a modular insulator design. Each of the identical sensing modules 105 contains one or multiple electro-optic crystals 6 and PM fiber sections 103, 104 arranged in such a way that the differential optical path lengths are sufficiently compensated (as described above by equation (9)). The modules 105 can then be connected in series to form a voltage sensor consisting of an arbitrary number of individual sensors, each measuring a fraction of the total voltage. The PM fiber connection between the modules may be realized by 90° splices 110 as shown in FIG. 14. Alternatively, PM fiber connectors can be used with the fibers oriented at 90° with respect to each other.

Figure 15:
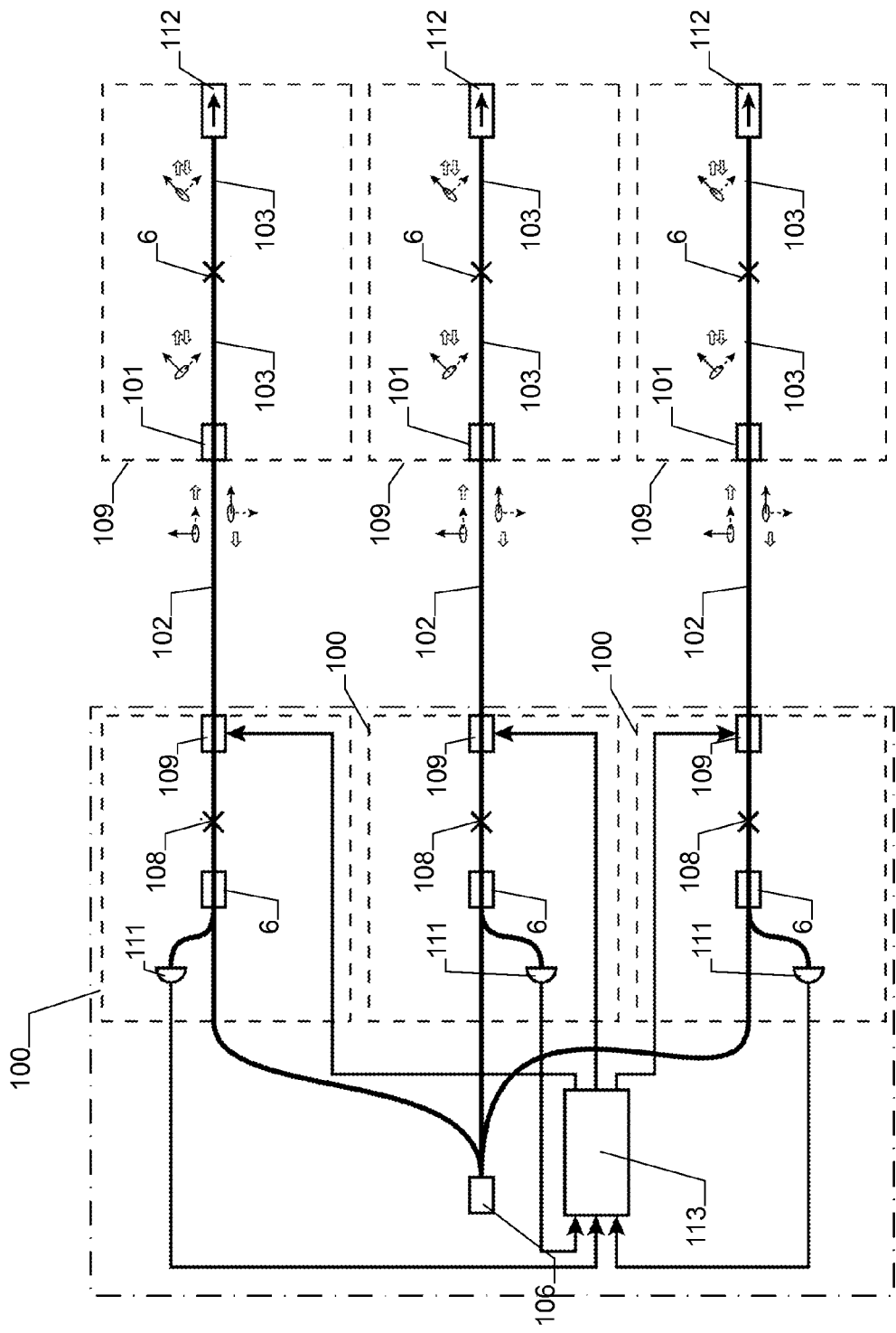
FIG. 15 shows a configuration with parallel arrangement of sensing elements resulting in three parallel measurement channels, where channels can share a common light source and signal processor according to an exemplary embodiment of the present disclosure.

FIG. 15 shows a parallel arrangement of three identical modules having a common light source 106. This arrangement is of particular interest when measuring the voltages of three electric phases, e.g. in a high-voltage substation. A common light source 106 and signal processor may be used for all three parallel channels. Each channel can again feature a series of several modules.

FIG. 16 shows a sensor arrangement with compensation of optical phase shifts introduced by mechanical perturbations of the two fiber sections after the Faraday rotator 101. The two fiber sections 103, 104 run along the same path such that they see the same mechanical perturbations. The mechanically-induced differential phase shifts in the two segments are then essentially of the same magnitude, but due to the 90°-splice 110 they have opposite sign and therefore tend to cancel each other. The electric field sensors on the other hand are oriented with respect to the fiber axes such that the electro-optic phase shifts have the same sign for a given field direction and thus add up.

The voltage sensors described above use a number of electro-optic field sensors which measure the local electric field resulting from a high voltage applied to the ends of an electric insulator. In accordance with an exemplary embodiment, the electro-optic field sensors are designed such that they only measure the component of the electric field along the direct path between both ends of the insulator, for example, along the axial direction. A specially designed hollow core insulator rod is used, featuring embedded metal foils for capacitive field steering in order to form measurement cavities and to shield the electric field geometry from outside influences. The electro-optic field sensors can, for example, be placed inside these measurement cavities at specific locations showing a particularly high insensitivity to external field perturbations. The electro-optically induced phase shifts are measured using different techniques and allow determining the applied voltage from the local field measurements by appropriate calibration of the voltage sensor. A single or multiple electro-optic field sensors are placed inside a measurement cavity and a single or multiple measurement cavities are present in a single electric insulator. Moreover, multiple insulators can be arranged in series to cover a wide range of voltage levels.

As mentioned, the electrodes can be metal foils embedded within insulating insulator 1 with longitudinal dimensions selected such that a voltage applied to the ends of insulator 1 homogeneously drops over the length of the field sensor inside the sensing cavity 7 and over the full length of insulator 1 at its outer surface. Excessive peak electric fields are avoided.

In general terms and in accordance with an exemplary embodiment, the voltage sensor includes an insulator 1 with mutually insulated electrodes $Ei_j$, Es embedded therein. The electrodes are coaxial and cylindrical and overlap axially over part of their lengths. They are mutually staggered and guide the homogeneous field outside the sensor to a substantially homogeneous but higher field within the sensing cavity 7 within the insulator 1. A field sensor 6 is arranged within the sensing cavity 7 to measure the field. This design allows to produce compact voltage sensors for high voltage applications.

In accordance with an exemplary configuration as shown in FIG. 1, a single measurement cavity 7 is positioned at half the distance between the ends of the insulator. Alternatively, the measurement cavity can be positioned closer to one end of the insulator. This can reduce field inhomogeneities caused by external stray capacitances and asymmetric boundary conditions such as in the three cases shown in FIG. 3 where the sensor is located above a grounded plate and its upper end is attached to a high voltage line.

In accordance with another exemplary configuration, multiple measurement cavities 7 can be positioned along the axis of a single insulator and electrically connected in series to form a configuration similar to that of multiple serially connected insulators with a single measurement cavity.

Besides using sensing elements based on the Pockels effect as local electric field sensors, one can also place other types of sensing elements inside the measurement cavities. Examples are sensing elements based on the piezo-electric effect [6], on poled fibers [25-27], and miniature electro-optic devices on the tip of an optical fiber as described e.g. in [28]. The latter have been developed to map for example electric fields on integrated circuits.

Particularly with the arrangements of FIG. 8-16, residual temperature-induced phase shifts cannot be distinguished from electro-optic phase shifts caused by a dc or a slowly varying electric field. The configurations can therefore be used to measure ac fields or fields that vary in time significantly faster than other sources affecting the differential phase of the orthogonal polarizations.

As shown in FIG. 3, the electric field extends slightly beyond the limits of the measurement cavity. Placing the sensing element in this location is also possible and has the advantage of the sensing element being subject to lower field strengths.

An additional configuration with polarimetric detection uses multiple local field sensors connected by PM fiber links such that the electro-optic phase shifts of the individual sensors are accumulated. In this configuration, only the first sensor in the series is equipped with a polarizer at its input, and only the last sensor is equipped with a polarization analyzer at its output. The fast and slow axes of the fiber links between the sensors are parallel to the electro-optic axes. The differential optical path lengths are again balanced. Residual unbalanced thermal phase shifts of the orthogonal modes may result in an undefined and varying working point, which may require an appropriate signal processing technique [30]. At electro-optic phase modulations larger than $\pm\pi/2$, the procedure of [2, 3] may again be applied.

The above mentioned integrated-optic electric field sensors use the electro-optic phase shift of the two orthogonal polarizations of the fundamental spatial waveguide mode. Another conceivable alternative is to fabricate the waveguide with parameters such that it supports besides the fundamental mode one higher-order spatial mode, as known from dual-mode fibers [29], and measure the electro-optic phase shift between the fundamental mode and higher-order mode. In accordance with an exemplary embodiment, the waveguide is fabricated with elliptical shape in order to remove the degeneracy of the of the higher-order mode. In accordance with an exemplary embodiment, the light is polarized with the polarization parallel to the major or minor core axis. By aligning the input fiber pigtail of the waveguide with an appropriate offset the two spatial modes can be excited with about equal amplitudes. Similarly the output pigtail is also aligned with an offset in order to access one lobe of the double-lobed interference pattern [29].

Apart from the interrogation techniques mentioned above, alternative methods may be used to measure the electro-optic phase shifts including techniques based on white light interferometry [31, 32].

The polarization maintaining fibers mentioned above may be e.g. so-called Panda fibers, bow-tie fibers, elliptical-core fibers, elliptical cladding fibers, or any other type of fiber with polarization maintaining properties.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCES

1. P. A. Williams, et al., "Optical, thermo-optic, electro-optic, and photoelastic properties of bismuth germanate ($Bi_4Ge_3O_{12}$)," Appl. Opt. 35, 3562 (1996).
2. U.S. Pat. No. 4,904,931
3. U.S. Pat. No. 5,715,058
4. U.S. Pat. No. 5,001,419
5. EP 0 316 635 B1
6. EP 0 316 619 B1
7. U.S. Pat. No. 6,140,810
8. U.S. Pat. No. 6,252,388 B1
9. U.S. Pat. No. 6,380,725 B1
10. U.S. Pat. No. 6,876,188 B2
11. WO 2004/086064 A1
12. U.S. Pat. No. 5,029,273 A
13. G. A. Massey, et al., "Electromagnetic field components: their measurement using linear electrooptic and magnetooptic effects," Appl. Opt. 14, 2712 (1975).
14. H. Lefévre, The fiber-optic gyroscope. London, Boston: Artech House, 1993.
15. G. Frosio and R. Dändliker, "Reciprocal reflection interferometer for a fiber-optic Faraday current sensor," Appl. Opt. 33, 6111 (1994).
16. S. Wildermuth, et al., "Interrogation of a Birefringent Fiber Sensor by Nonreciprocal Phase Modulation," IEEE Photon. Technol. Lett. 22, 1388 (2010).
17. WO 2008/077255 A1
18. U.S. Pat. No. 3,875,327

19. U.S. Pat. No. 4,362,897
20. WO 2007/121592 A1
21. M. Lawrence, "Lithium niobate integrated optics," Rep. Prog. Phys. 56, 363 (1993).
22. T.-H. Lee, et al., "Electromagnetic field sensor using Mach-Zehnder waveguide modulator," Microw. Opt. Techn. Lett. 48, 1897 (2006).
23. T. Meyer, et al., "Reversibility of photoinduced birefringence in ultralow-birefringence fibers," Opt. Lett. 21, 1661 (1996).
24. EP 1 154 278 B1
25. U.S. Pat. No. 5,936,395
26. U.S. Pat. No. 6,348,786 B1
27. WO 2009/138120 A1
28. US 2010/0283451 A1
29. U.S. Pat. No. 5,339,026
30. J. Cole, et al., "Synthetic-heterodyne interferometric demodulation," IEEE J. Quantum Elect. 18, 694 (1982).
31. W. Urbanczyk, et al., "Digital Demodulation System for Low-Coherence Interferometric Sensors Based on Highly Birefringent Fibers," Appl. Opt. 40, 6618 (2001).
32. M. Campbell, et al., "A frequency-modulated continuous wave birefringent fibre-optic strain sensor based on a Sagnac ring configuration," Meas. Sci. Technol. 10, 218 (1999).

REFERENCE NUMBERS

1: insulator
2, 3: contact points
4: metal contacts
5: bore
6: field sensor
7: sensing cavity
8: longitudinal axis
10, 11: first and second region
14: central end of electrode
15: contact end of electrode
16: reference plane
20, 21: PM delivery fibers
22: detection unit
23: polarizing beam splitter
24: quarter wave plate
25: dielectric substrate
26: collimating lens
27: crystal
28, 29, 29': polarizers
30: focusing lens
31: non-polarizing beam splitter element
32, 32': channels
33, 33': detectors
34: waveguide
35: polarizing layer
100: control unit
101: Faraday rotator
102: connecting PM fiber
103: first PM fiber section
104: second PM fiber section
105: sensing module
106: light source
107: inline fiber polarizer
108: 45° splice
109: sensor head
110: 90° splice
111: PM fiber
112: reflective coating or mirror
113: signal processor
114: detector

What is claimed is:

1. A high-voltage sensor for measuring a voltage between a first contact point and a second contact point, the high-voltage sensor comprising:
    an insulator composed of an insulating material extending along an axial direction between the first and second contact points, and including a sensing cavity;
    a plurality of conductive electrodes arranged in the insulator, the conductive electrodes being mutually separated by the insulating material and capacitively coupled to each other; and
    at least one electric field sensor arranged in the sensing cavity of the insulator, wherein:
    for at least part of the conductive electrodes, each conductive electrode axially overlaps at least one other one of the conductive electrodes;
    the conductive electrodes are configured to steer an electric field in the sensing cavity so that the electric field has a mean field strength larger than the voltage between the first and second contact points divided by a distance between the first and second contact points;
    the at least one electric field sensor is a local electric field sensor configured to measure the field over only part of an axial extension of the sensing cavity,
    the high-voltage sensor comprises at least a first primary electrode electrically connected to the first contact point and a second primary electrode electrically connected to the second contact point; and
    the conductive electrodes form a capacitive voltage divider between the first and second primary electrodes.

2. The high-voltage sensor of claim 1, wherein the at least one electric field sensor includes at least one optical sensor configured to introduce a field-dependent phase shift $\Delta\phi$ between a first sensor polarization or sensor mode and a second sensor polarization or sensor mode of light passing through the at least one optical sensor, and
    wherein the at least one optical sensor comprises one of:
    an electro-optical device with field-dependent birefringence, or a poled waveguide exhibiting a Pockels effect; and
    a piezo-electric device and a waveguide carrying at least two modes, the waveguide being connected to the piezo-electric device such that a length of the waveguide is field-dependent.

3. The high-voltage sensor of claim 2, comprising:
    a plurality of the optical sensors arranged optically in series.

4. The high-voltage sensor of claim 2, comprising:
    a control unit configured to determine a voltage from a phase shift between light passing through the at least one optical sensor in the first sensor polarization or sensor mode and light passing through the at least one optical sensor in the second sensor polarization or sensor mode; and
    a Faraday rotator arranged between the control unit and the at least one optical sensor, the Faraday rotator configured to cause a nonreciprocal rotation of the light by 45° for each pass.

5. The high-voltage sensor of claim 4, comprising:
    at least one first and at least one second polarization maintaining fiber section arranged optically in series and connected to guide the light between two passes through the Faraday rotator, wherein main axes of the first and second polarization maintaining fibers sections are mutually rotated by 90°.

6. The high-voltage sensor of claim 5, comprising:
a plurality of sensing modules arranged optically in series, wherein each sensing module comprises at least one of the first and at least one of the second polarization maintaining fiber sections and at least one optical sensor.

7. The high-voltage sensor of claim 2, comprising:
a polarization maintaining fiber having at least a first polarization mode, wherein the polarization maintaining fiber is connected to the at least one optical sensor such that (i) light passing the at least one optical sensor in the first sensor polarization or sensor mode, and (ii) light passing the at least one optical sensor in the second sensor polarization or sensor mode are both partially coupled into the first polarization mode of the polarization maintaining fiber; and
a detector unit connected to the polarization maintaining fiber, the detector unit comprising at least a first light detector measuring light passing through the first polarization mode of the polarization maintaining fiber.

8. The high-voltage sensor of claim 2, wherein a temperature derivative of an electro-optic effect of the at least one optical sensor has an opposite sign to a temperature derivative $\partial |E_{z,mean}|/\partial T$ of a mean absolute value of an axial electrical field component in the at least one optical sensor.

9. The high-voltage sensor of claim 2, wherein the at least one optical sensor comprises a waveguide.

10. The high-voltage sensor of claim 2, wherein the at least one optical sensor is of a III-V-semiconductor.

11. The high-voltage sensor of claim 1, wherein:
the sensing cavity is symmetrical with respect to a reference plane extending perpendicularly to the axial direction; and
a position of the at least one electric field sensor is symmetrical with respect to the reference plane.

12. The high-voltage sensor of claim 1, wherein:
the sensing cavity is symmetrical with respect to a reference plane extending perpendicularly to the axial direction; and
a plurality of the electric field sensors are arranged symmetrically with respect to the reference plane.

13. An assembly of several high-voltage sensors of claim 1.

14. The assembly of claim 13, comprising:
several of the high-voltage sensors arranged in at least one of series and parallel to each other.

15. The assembly of claim 13, comprising at least one of for the high-voltage sensors:
a common light source; and
a signal processor.

16. The high-voltage sensor of claim 1, wherein at least one of the conductive electrodes is a shield electrode radially surrounding the sensing cavity.

17. The high-voltage sensor of claim 1, wherein:
the conducting electrodes comprise a first set of electrodes $E1_i$ with i=1 ... N1, and a second set of electrodes $E2_i$ with i=1 ... N2;
the electrodes $E1_i$ of the first set are arranged in a first region of the insulator, the first region extending from a reference plane of the sensing cavity to the first contact point;
the electrodes $E2_i$ of the second set are arranged in a second region of the insulator, the second region extending from the reference plane to the second contact point; and
the reference plane extends radially through the sensing cavity.

18. The high-voltage sensor of claim 17, wherein a first electrode $E1_1$ of the first set forms the first primary electrode, and a first electrode $E2_1$ of the second set forms the second primary electrode.

19. The high voltage sensor of claim 17, wherein:
for each set j of electrodes, the electrodes $Ej_i$ and $Ej_{i+1}$ and axially overlap along an overlapping section; and
in the overlapping section, the electrode $Ej_{i+1}$ is arranged radially outside from the electrode $Ej_i$.

20. The high-voltage sensor of claim 17, wherein, for each set j of electrodes:
each electrode has a center end facing the reference plane and a contact end arranged axially opposite to the center end;
the center end of the electrode $Ej_{i+1}$ is closer to the reference plane than the center end of the electrode $Ej_i$, and the contact end of the electrode $Ej_{i+1}$ is closer to the reference plane than the contact end of the electrode $Ej_i$;
the center end of the electrode $Ej_{i+1}$ has an axial distance $Bj_i$ from the center end of the electrode $Ej_i$, and the contact end of the electrode $Ej_{i+1}$ has an axial distance $Cj_i$ from the contact end of the electrode $Ej_i$; and
the electrodes $Ej_i$ and $Ej_{i+1}$ axially overlap along an overlapping section, such that, in the overlapping section, the electrode is arranged radially outside from the electrode $Ej_i$.

21. The high-voltage sensor of claim 20 wherein, for each set j of electrodes, the axial distance $Bj_i$ is smaller than the axial distance $Cj_i$.

22. The high-voltage sensor of claim 21, wherein, for each set j of electrodes, at least one of (i) the axial distances $Bj_i$ are substantially equal to a common distance B, and (ii) the axial distances $Cj_i$ are substantially equal to a common distance C.

23. The high-voltage sensor of claim 17, wherein:
at least one of the conductive electrodes is a shield electrode radially surrounding the sensing cavity; and
the shield electrode axially overlaps with at least one electrode of the first set and at least one electrode of the second set.

24. The high-voltage sensor of claim 17, wherein the electrodes $E1_i$ of the first set are equally spaced in the radial direction, and the electrodes $E2_i$ of the second set are equally spaced in the radial direction.

25. The high-voltage sensor of claim 1, wherein the conducting electrodes are arranged symmetrically with respect to a reference plane extending radially through the sensing cavity.

26. The high-voltage sensor of claim 1, wherein at least part of the conducting electrodes are at least one of substantially cylindrical and substantially coaxial to each other.

27. The high-voltage sensor of claim 1, comprising:
a dielectric substrate arranged in the cavity and configured to hold the at least one electric field sensor,
wherein the substrate has the shape of a beam extending axially through the cavity.

28. The high-voltage sensor of claim 17, wherein the sensing cavity has an axial length, which is the axial distance between a center end of the first primary electrode of the first set of electrodes and a center end of the second primary electrode of the second set of electrodes.

29. The high-voltage sensor of claim 28, wherein an axial length of the at least one electric field sensor is smaller than the axial length of the sensing cavity.

30. The high-voltage sensor of claim 2, wherein:
the electro-optical device with field-dependent birefringence is composed of a material selected from the group consisting of: crystal, crystalline $Bi_4Ge_3O_{12}$ (BGO) and $Bi_4Si_3O_{12}$ (BSO); and
the piezo-electric device is composed of one of crystalline quartz and a piezoelectric ceramic.

31. The high-voltage sensor of claim 5, wherein a total differential group delay $\Delta Lg$ of the polarization maintaining fiber sections is smaller than a coherence length of a source of the light.

32. The high-voltage sensor of claim 5, wherein a temperature derivative of an electro-optic effect of the at least one optical sensor has an opposite sign to a temperature derivative $\partial |E_{z,mean}|/\partial T$ of a mean absolute value of an axial electrical field component in the at least one optical sensor.

33. The high-voltage sensor of claim 7, wherein a temperature derivative of an electro-optic effect of the at least one optical sensor has an opposite sign to a temperature derivative $\partial |E_{z,mean}|/\partial T$ of a mean absolute value of an axial electrical field component in the at least one optical sensor.

34. The high-voltage sensor of claim 10, wherein the III-V-semiconductor is composed of GaAs.

35. The high-voltage sensor of claim 17, wherein N1=N2.

36. The high-voltage sensor of claim 23, wherein the shield electrode axially overlaps with a radially outmost electrode of the first set and a radially outmost electrode of the second set, and the shield electrode is arranged radially outside from respective outmost electrodes of the first and the second sets.

37. The high-voltage sensor of claim 29, wherein the axial length of the at least one electric field sensor is at least five times smaller than the axial length of the cavity.

* * * * *